(12) United States Patent
Nakagawa et al.

(10) Patent No.: US 11,966,008 B2
(45) Date of Patent: Apr. 23, 2024

(54) OPTICAL FILM AND LIQUID CRYSTAL FILM

(71) Applicant: FUJIFILM Corporation, Tokyo (JP)

(72) Inventors: Kazushige Nakagawa, Kanagawa (JP); Hideyuki Nishikawa, Kanagawa (JP); Masato Nakao, Kanagawa (JP); Shunya Katoh, Kanagawa (JP); Hiroyuki Hagio, Kanagawa (JP); Yutaka Nozoe, Kanagawa (JP); Kunihiro Kasezawa, Kanagawa (JP); Yuki Nakamura, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 17/878,873

(22) Filed: Aug. 1, 2022

(65) Prior Publication Data

US 2022/0381953 A1    Dec. 1, 2022

Related U.S. Application Data

(63) Continuation of application No. PCT/JP2021/004316, filed on Feb. 5, 2021.

(30) Foreign Application Priority Data

Feb. 6, 2020  (JP) ................. 2020-018836
Jan. 21, 2021  (JP) ................. 2021-007971

(51) Int. Cl.
*G02B 1/111*    (2015.01)
*C09K 19/38*    (2006.01)
(Continued)

(52) U.S. Cl.
CPC .......... *G02B 1/111* (2013.01); *C09K 19/3861* (2013.01); *C09K 19/56* (2013.01); *G02F 1/133502* (2013.01); *H10K 50/86* (2023.02)

(58) Field of Classification Search
None
See application file for complete search history.

(56) References Cited

U.S. PATENT DOCUMENTS 8,173,729 B2   5/2012  Youn et al.
9,383,491 B2   7/2016  Takeda et al.
(Continued)

FOREIGN PATENT DOCUMENTS

CN    101825843    9/2010
CN    104345367    2/2015
(Continued)

OTHER PUBLICATIONS

"International Search Report (Form PCT/ISA/210) of PCT/JP2021/004316," dated Apr. 6, 2021, with English translation thereof, pp. 1-6.
(Continued)

*Primary Examiner* — Ryan Crockett
(74) *Attorney, Agent, or Firm* — JCIPRNET

(57) ABSTRACT

The present invention provides an optical film having a liquid crystal layer having excellent durability, and a liquid crystal film. The optical film of the present invention has an organic base material and a liquid crystal layer disposed on the organic base material, the liquid crystal layer contains a photo-alignment compound, and in the liquid crystal layer, the photo-alignment compound is unevenly distributed on a side of the organic base material.

16 Claims, 2 Drawing Sheets

(51) Int. Cl.
*C09K 19/56* (2006.01)
*G02F 1/1335* (2006.01)
*H10K 50/86* (2023.01)

(56) References Cited

U.S. PATENT DOCUMENTS

| | | | |
|---|---|---|---|
| 10,228,572 | B2 | 3/2019 | Asanoi et al. |
| 10,620,481 | B2 | 4/2020 | Wakita et al. |
| 10,782,567 | B2 | 9/2020 | Takahashi et al. |
| 11,225,605 | B2 | 1/2022 | Hayashi et al. |
| 2019/0004225 | A1* | 1/2019 | Iijima .................. G02B 5/3016 |
| 2019/0162889 | A1* | 5/2019 | Delbaere ........... G02F 1/133528 |
| 2019/0173198 | A1* | 6/2019 | Mizusaki ........... H01Q 21/0087 |
| 2019/0271885 | A1* | 9/2019 | Takahashi ............. G02B 6/0056 |
| 2022/0035086 | A1 | 2/2022 | Delbaere et al. |
| 2022/0171096 | A1* | 6/2022 | Maruyama ........... C09K 19/586 |

FOREIGN PATENT DOCUMENTS

| | | |
|---|---|---|
| CN | 108291999 | 7/2018 |
| CN | 109477930 | 3/2019 |
| CN | 110325525 | 10/2019 |
| JP | 2008276165 | 11/2008 |
| JP | 2015132093 | 7/2015 |
| JP | 2015200858 | 11/2015 |
| JP | 2016109800 | 6/2016 |
| JP | 2019095553 | 6/2019 |
| JP | 2019522245 | 8/2019 |
| JP | 2019207390 | 12/2019 |
| KR | 20120099183 | 9/2012 |
| WO | 2004063780 | 7/2004 |
| WO | 2017069252 | 4/2017 |
| WO | 2017164004 | 9/2017 |

OTHER PUBLICATIONS

"Written Opinion of the International Searching Authority (Form PCT/ISA/237)" of PCT/JP2021/004316, dated Apr. 6, 2021, with English translation thereof, pp. 1-8.
"Office Action of China Counterpart Application", dated Aug. 26, 2023, with English translation thereof, p. 1-p. 11.
"Office Action of Japan Counterpart Application", dated Aug. 29, 2023, with English translation thereof, pp. 1-8.

* cited by examiner

OPTICAL FILM AND LIQUID CRYSTAL FILM

CROSS-REFERENCE TO RELATED APPLICATIONS

This application is a Continuation of PCT International Application No. PCT/JP2021/004316 filed on Feb. 5, 2021, which claims priority under 35 U.S.C. § 119(a) to Japanese Patent Application No. 2020-018836 filed on Feb. 6, 2020 and Japanese Patent Application No. 2021-007971 filed on Jan. 21, 2021. Each of the above applications is hereby expressly incorporated by reference, in its entirety, into the present application.

BACKGROUND OF THE INVENTION

1. Field of the Invention

The present invention relates to an optical film and a liquid crystal film.

2. Description of the Related Art

A liquid crystal layer formed of a liquid crystal compound is used for an optical film used in a display field.

As a method of forming a liquid crystal layer, a method using a photo-alignment film containing a photo-alignment compound is known (WO2017/069252A).

SUMMARY OF THE INVENTION

On the other hand, in recent years, the liquid crystal layer is required to have more excellent durability. Specifically, it is required that the retardation of the liquid crystal layer does not change in a high temperature and high humidity environment.

The present inventors found that as a result of transferring a liquid crystal layer formed of a photo-alignment film disclosed in WO2017/069252A on a base material and evaluating properties thereof, further improvement is required on the durability of the liquid crystal layer.

In view of the above circumstances, an object of the present invention is to provide an optical film having a liquid crystal layer having excellent durability.

In addition, another object of the present invention is to provide a liquid crystal film having excellent durability.

As a result of intensive studies to achieve the above object, the present inventors have completed the present invention having the following configuration.

(1) An optical film including an organic base material; and a liquid crystal layer disposed on the organic base material, in which the liquid crystal layer contains a photo-alignment compound, and in the liquid crystal layer, the photo-alignment compound is unevenly distributed on a side of the organic base material.

(2) The optical film according to (1), in which an uneven distribution degree obtained by an uneven distribution degree calculation method 1 described later is 3.5 or more.

(3) The optical film according to (1) or (2), in which the organic base material has a hydrogen-bonding group on a surface on a side of the liquid crystal layer.

(4) The optical film according to any one of (1) to (3), in which the photo-alignment compound includes an interacting group selected from the group consisting of a hydrogen-bonding group, a group having a salt structure, a boronic acid group, a boronic acid ester group, and a group represented by Formula (1) described later.

(5) The optical film according to any one of (1) to (4), in which the photo-alignment compound has at least one of repeating units represented by Formulae (2) to (6) described later.

(6) The optical film according to any one of (1) to (5), in which the photo-alignment compound has at least one of repeating units represented by Formulae (7) to (9) described later.

(7) The optical film according to any one of (1) to (6), in which the liquid crystal layer is formed of a composition containing a liquid crystal compound and a photo-alignment compound, and a content of the photo-alignment compound in the composition is 0.01% to 30% by mass with respect to a total mass of the liquid crystal compound.

(8) The optical film according to (7), in which a homogeneously aligned liquid crystal compound is fixed to a surface region on the side of the organic base material in the liquid crystal layer.

(9) A liquid crystal film including two main surfaces, in which the liquid crystal film contains a photo-alignment compound and a leveling agent, in the liquid crystal film, the leveling agent is unevenly distributed on a side of one main surface, and in the liquid crystal film, the photo-alignment compound is unevenly distributed on a side of the other main surface.

(10) The liquid crystal film according to (9), in which an uneven distribution degree obtained by an uneven distribution degree calculation method 3 described later is 3.5 or more.

(11) The liquid crystal film according to (9) or (10), in which the leveling agent has a fluorine atom or a silicon atom.

(12) The liquid crystal film according to any one of (9) to (11), in which the photo-alignment compound includes an interacting group selected from the group consisting of a hydrogen-bonding group, a group having a salt structure, a boronic acid group, a boronic acid ester group, and a group represented by Formula (1) described later.

(13) The liquid crystal film according to any one of (9) to (12), in which the photo-alignment compound has at least one of repeating units represented by Formulae (2) to (6) described later.

(14) The liquid crystal film according to any one of (9) to (13), in which the photo-alignment compound has at least one of repeating units represented by Formulae (7) to (9) described later.

(15) The liquid crystal film according to any one of (9) to (14), in which the liquid crystal film is formed of a composition containing a liquid crystal compound and a photo-alignment compound, and a content of the photo-alignment compound in the composition is 0.01% to 30% by mass with respect to a total mass of the liquid crystal compound.

(16) The liquid crystal film according to (15), in which a homogeneously aligned liquid crystal compound is fixed to a surface region on the side where the photo-alignment compound in the liquid crystal film is unevenly distributed.

According to the present invention, it is an object to provide an optical film having a liquid crystal layer having excellent durability.

In addition, according to the present invention, it is another object to provide a liquid crystal film having excellent durability.

DESCRIPTION OF THE PREFERRED EMBODIMENTS

Figure 1:
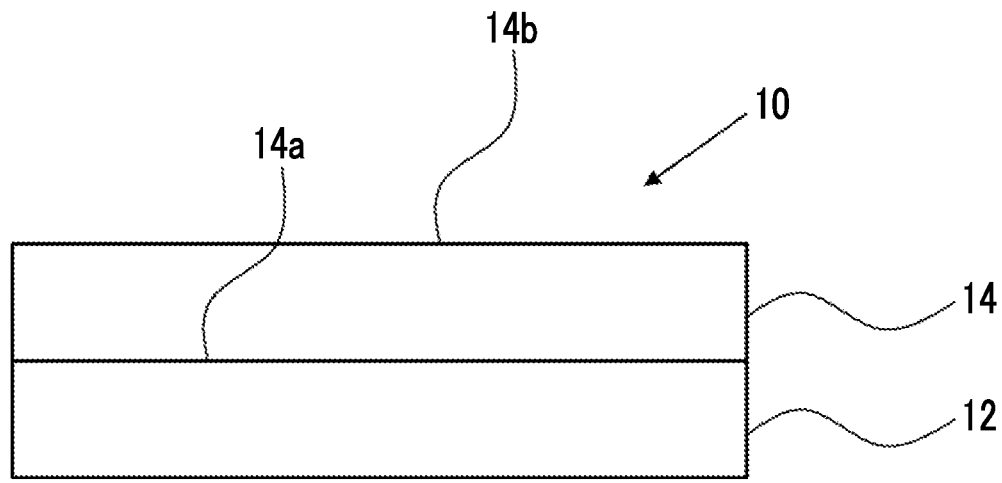
FIG. 1 is a schematic cross-sectional view showing one embodiment of an optical film of the present invention.

Hereinafter, the details of the present invention will be described.

The following description of constituent requirements is based on representative embodiments of the present invention, but the present invention is not limited thereto.

In the present specification, the numerical range represented by "to" means a range including numerical values denoted before and after "to" as a lower limit value and an upper limit value.

In the present specification, "(meth)acrylate" represents "either or both of acrylate and methacrylate".

In the present invention, $Re(\lambda)$ and $Rth(\lambda)$ represent an in-plane retardation and a thickness-direction retardation at a wavelength of $\lambda$, respectively. Unless specified otherwise, the wavelength of $\lambda$ refers to 550 nm.

In the present specification, $Re(\lambda)$ and $Rth(\lambda)$ are values measured at the wavelength of $\lambda$ in AxoScan (manufactured by Axometrics, Inc.). By inputting an average refractive index $((nx+ny+nz)/3)$ and a film thickness (d (μm)) to AxoScan, the value can be calculated:

Slow phase axial direction (°)

$Re(\lambda)=R0(\lambda)$ $Rth(\lambda)=((nx+ny)/2-nz)\times d$

R0(k) is expressed as a numerical value calculated by AxoScan and means $Re(\lambda)$.

In the present specification, the refractive indices, nx, ny, and nz are measured using an Abbe refractometer (NAR-4T, manufactured by ATAGO CO., LTD.) and using a sodium lamp ($\lambda=589$ nm) as a light source. In addition, in a case where wavelength dependency is measured, the wavelength dependency can be measured by a multi-wavelength Abbe refractometer DR-M2 (manufactured by ATAGO CO., LTD.) in combination with a dichroic filter.

In addition, values in Polymer Handbook (JOHN WILEY & SONS, INC.) and catalogues of various optical films can be used. Values of average refractive indices of major optical films are exemplified below: cellulose acylate (1.48), cycloolefin polymer (1.52), polycarbonate (1.59), polymethyl methacrylate (1.49), and polystyrene (1.59).

In the present specification, the term "light" means active light or radiation, for example, an emission line spectrum of a mercury lamp, far ultraviolet rays typified by an excimer laser, extreme ultraviolet rays (EUV light), X-rays, ultraviolet rays, an electron beam (EB), and the like. Among these, ultraviolet rays are preferable.

In addition, a bonding direction of a divalent group (for example, —O—CO—) described in the present specification is not particularly limited, and for example, in a case where $L^2$ in a "$L^1$-$L^2$-$L^3$" bond is —O—CO—, and a bonding position on the $L^1$ side is represented by *1 and a bonding position on the $L^3$ side is represented by *2, $L^2$ may be *1-O—CO-*2 or *1-CO—O-*2.

A feature of the optical film according to the embodiment of the present invention is that the photo-alignment compound is unevenly distributed on one surface side in the liquid crystal layer of the optical film. In a case where the photo-alignment compound is unevenly distributed as described above, the photo-alignment compound functions as a barrier layer and can prevent moisture and the like from entering the liquid crystal from the surface side thereof, and as a result, the durability of the liquid crystal layer is excellent. In particular, by unevenly distributing the photo-alignment compound on the surface side of the liquid crystal layer contained in the optical film on the organic base material side, when the liquid crystal layer is transferred to a transfer target, a side where the photo-alignment compound is unevenly distributed is the surface side (air side), and the function as a barrier layer tends to be more exhibited.

The liquid crystal film according to the embodiment of the present invention also has excellent durability due to the same mechanism.

FIG. 1 shows an example of the optical film according to the embodiment of the present invention.

As shown in FIG. 1, an optical film 10 has an organic base material 12 and a liquid crystal layer 14. In the liquid crystal layer 14, the photo-alignment compound is unevenly distributed on a side of the organic base material 12. That is, the photo-alignment compounds are unevenly distributed in the vicinity of a surface 14a of the liquid crystal layer 14 on the side of the organic base material 12.

In addition, the liquid crystal layer 14 contains a leveling agent, and the leveling agent is unevenly distributed on a side opposite to the side of the organic base material 12 in the liquid crystal layer 14. That is, the leveling agent is unevenly distributed in the vicinity of a surface 14b on the side opposite to the side of the organic base material 12 in the liquid crystal layer 14.

In addition, the above liquid crystal layer 14 containing the leveling agent and the photo-alignment compound corresponds to the liquid crystal film of the embodiment of the present invention. That is, such a liquid crystal film of the embodiment of the present invention has two main surfaces, the liquid crystal film contains a photo-alignment compound and a leveling agent, and the leveling agent is unevenly distributed on one main surface side in the liquid crystal film and the photo-alignment compound is unevenly distributed on the other main surface side in the liquid crystal film.

As will be described later, the leveling agent may or may not be contained in the liquid crystal layer.

Hereinafter, first, the distribution of the photo-alignment compound and the leveling agent in the liquid crystal layer 14 will be described in detail.

In the liquid crystal layer 14 shown in FIG. 1, the photo-alignment compound is unevenly distributed on the side of the organic base material 12.

The fact that the photo-alignment compound is unevenly distributed on the side of the organic base material 12 corresponds to the fact that the uneven distribution degree calculated by the uneven distribution degree calculation method 1 described later is 2.0 or more.

Hereinafter, the uneven distribution degree calculation method 1 will be described in detail.

First, a secondary ion intensity derived from the photo-alignment compound in the liquid crystal layer is measured by time-of-flight secondary ion mass spectrometry (TOF-SIMS) while emitting an ion beam, from the surface of the liquid crystal layer on the side opposite to the side of the organic base material toward the side of the organic base material. Examples of the type of ion beam include an ion beam using an argon gas cluster ion gun (Ar-GCIB gun).

Figure 2:
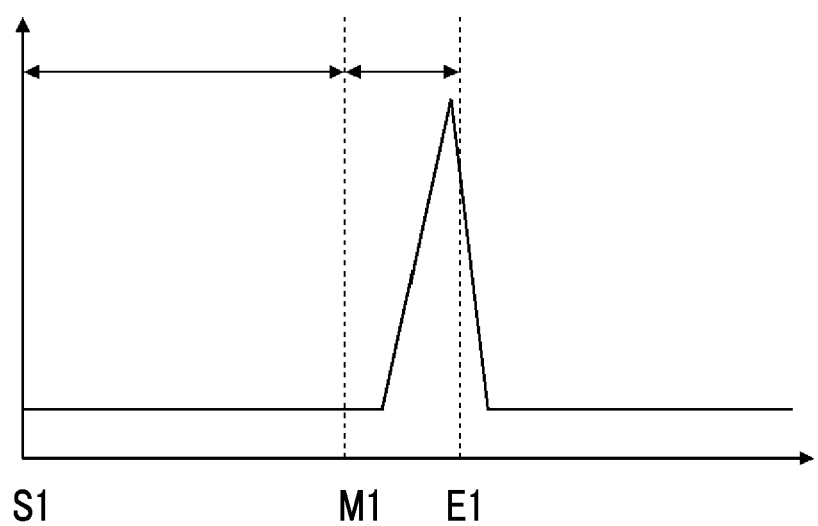
FIG. 2 is an example of a secondary ion intensity distribution derived from a photo-alignment compound obtained by time-of-flight secondary ion mass spectrometry.

FIG. 2 is an example of the secondary ion intensity distribution derived from the photo-alignment compound obtained by TOF-SIMS analysis. A horizontal axis is a distance (nm) from the surface of the liquid crystal layer on the side opposite to the side of the organic base material, and a vertical axis is an intensity of the secondary ion derived from the photo-alignment compound. In FIG. 2, points S1 to E1 represent the secondary ion intensity derived from the photo-alignment compound in the liquid crystal layer, and points E1 and thereafter represent the secondary ion intensity derived from the photo-alignment compound in the organic base material. That is, points S1 to E1 correspond to the liquid crystal layer, and points E1 and thereafter correspond to the organic base material.

There is a case where a portion of the photo-alignment compound may invade the inside of the organic base material, and in this case, as shown in FIG. 2, the secondary ion intensity derived from the photo-alignment compound is observed in the organic base material.

Next, in a case where a region from the surface of the liquid crystal layer on the side opposite to the side of the organic base material to a depth position equivalent to 80% of a total thickness of the liquid crystal layer (hereinafter, also referred to as "depth position M1") toward the side of the organic base material is denoted as an upper layer region and a region from the depth position M1 to a surface of the liquid crystal layer on the side of the organic base material is denoted as a lower layer region, in a case where a ratio of a maximum value $I_{A1}$ of the secondary ion intensity derived from the photo-alignment compound in the lower layer region to an average value $I_{A2}$ of the secondary ion intensity derived from the photo-alignment compound in the upper layer region is 2.0 or more, the photo-alignment compound is unevenly distributed on the side of the organic base material.

That is, first, as shown in FIG. 2, a region from point S1 corresponding to the surface of the liquid crystal layer on a side opposite to the side of the organic base material to point M1 corresponding to the depth position equivalent to 80% of the total thickness of the liquid crystal layer toward the side of the organic base material is denoted as an upper layer region, and a region from point M1 to point E1 corresponding to the surface of the liquid crystal layer on the side of the organic base material is denoted as a lower layer region. Next, in a case where the average value $I_{A2}$ of the secondary ion intensity derived from the photo-alignment compound in the upper layer region and the maximum value $I_{A1}$ of the secondary ion intensity derived from the photo-alignment compound in the lower layer region are calculated, and a ratio ($I_{A1}/I_{A2}$) is 2.0 or more, it is assumed that the photo-alignment compound is unevenly distributed on the side of the organic base material.

It is shown that the larger the above ratio ($I_{A1}/I_{A2}$) is, the more the photo-alignment compound is unevenly distributed on the side of the organic base material.

From a viewpoint of more excellent durability of the liquid crystal layer or the liquid crystal film (hereinafter, simply referred to as "viewpoint that the effect of the present invention is more excellent"), the above ratio ($I_{A1}/I_{A2}$) is preferably 3.0 or more, more preferably 3.5 or more, and even more preferably 5.0 or more. An upper limit is not particularly limited, but is 30.0 or less in many cases, and 20.0 or less in more cases.

In the liquid crystal layer 14 shown in FIG. 1, the leveling agent is unevenly distributed on the side opposite to the side of the organic base material 12.

The fact that the leveling agent is unevenly distributed on the side opposite to the side of the organic base material 12 corresponds to the fact that the uneven distribution degree calculated by the uneven distribution degree calculation method 2 described later is 2.0 or more.

Hereinafter, the uneven distribution degree calculation method 2 will be described in detail.

First, a secondary ion intensity derived from the leveling agent in the liquid crystal layer is measured by time-of-flight secondary ion mass spectrometry (TOF-SIMS) while emitting an ion beam, from the surface of the liquid crystal layer on the side opposite to the side of the organic base material toward the side of the organic base material. Examples of the type of ion beam include an ion beam using an argon gas cluster ion gun (Ar-GCIB gun).

Figure 3:
FIG. 3 is an example of a secondary ion intensity distribution derived from a leveling agent obtained by time-of-flight secondary ion mass spectrometry.

FIG. 3 is an example of the secondary ion intensity distribution derived from the leveling agent obtained by TOF-SIMS analysis. The horizontal axis is a distance (nm) from the surface of the liquid crystal layer on the side opposite to the side of the organic base material, and the vertical axis is the intensity of the secondary ion derived from the leveling agent. In FIG. 3, points S2 to E2 represent the secondary ion intensity derived from the leveling agent in the liquid crystal layer, and points E2 and thereafter represent the secondary ion intensity derived from the leveling agent in the organic base material. That is, points S2 to E2 correspond to the liquid crystal layer, and points E2 and thereafter correspond to the organic base material.

Next, in a case where a region from the surface of the liquid crystal layer on the side opposite to the side of the organic base material to a depth position equivalent to 20% of a total thickness of the liquid crystal layer (hereinafter, also referred to as "depth position M1") toward the side of the organic base material is denoted as an upper layer region and a region from the depth position M2 to the surface of the liquid crystal layer on the side of the organic base material is denoted as a lower layer region, in a case where a ratio of a maximum value $I_{B1}$ of the secondary ion intensity derived from the leveling agent in the upper layer region to an average value $I_{B2}$ of the secondary ion intensity derived from the leveling agent in the lower layer region is 2.0 or more, the leveling agent is unevenly distributed on the side opposite to the side of the organic base material.

That is, first, as shown in FIG. 3, a region from point S2 corresponding to the surface of the liquid crystal layer on the side opposite to the side of the organic base material to point M2 corresponding to a depth position equivalent to 20% of the total thickness of the liquid crystal layer toward the side of the organic base material is denoted as an upper layer region, and a region from point M2 to point E2 corresponding to the surface of the liquid crystal layer on the side opposite to the side of the organic base material is denoted as a lower layer region. Next, in a case where the average value $I_{B2}$ of the secondary ion intensity derived from the leveling agent in the lower layer region and the maximum value $I_{B1}$ of the secondary ion intensity derived from the leveling agent in the upper layer region are calculated, and the ratio ($I_{B1}/I_{B2}$) is 2.0 or more, it is assumed that the leveling agent is unevenly distributed on the side opposite to the side of the organic base material.

It is shown that the larger the above ratio ($I_{B1}/I_{B2}$) is, the more the leveling agent is unevenly distributed on the side opposite to the side of the organic base material.

From a viewpoint that the effect of the present invention is more excellent, the above ratio ($I_{B1}/I_{B2}$) is preferably 30.0 or more, and more preferably 60.0 or more. An upper limit is not particularly limited, but is 300.0 or less in many cases, and 150.0 or less in more cases.

The liquid crystal layer in the optical film may be transferred to the transfer target. That is, the optical film may function as a so-called transfer film.

Hereinafter, each member constituting the optical film will be described in detail.

<Organic Base Material>

The organic base material is a member that supports the liquid crystal layer.

The organic base material may be made of an organic material, and a resin base material is preferable.

Examples of the resin base material include cellulose-based polymers; acrylic polymers such as polymethyl methacrylate and acrylic acid ester polymer which is a lactone ring-containing polymer; thermoplastic norbornene-based polymers; polycarbonate-based polymers; polyester-based polymers such as polyethylene terephthalate and polyethylene naphthalate; styrene-based polymers such as polystyrene and an acrylonitrile-styrene copolymer; polyolefin-based polymers such as polyethylene, polypropylene, and an ethylene-propylene copolymer; vinyl chloride-based polymers; amide-based polymers such as nylon and aromatic polyamide; imide-based polymers; sulfone-based polymers; polyether sulfone-based polymers; polyether ether ketone-based polymers; polyphenylene sulfide-based polymers; vinylidene chloride-based polymers; vinyl alcohol-based polymers; vinyl butyral-based polymers; arylate-based polymers; polyoxymethylene-based polymers; epoxy-based polymers; and polymers obtained by mixing these polymers.

The organic base material preferably has a hydrogen-bonding group on the surface on the side of the liquid crystal layer.

Examples of the hydrogen-bonding group include a hydroxy group, a thiol group, a carboxy group, an amino group, an amide group, a urea group, and a urethane group, and a hydroxy group is preferable from a viewpoint that the effect of the present invention is more excellent.

A method of introducing a hydrogen-bonding group on the surface of the organic base material is not particularly limited, and examples thereof include known surface treatment methods such as corona treatment and ultraviolet ray irradiation treatment.

In addition, the material (for example, a polymer) constituting the organic base material itself may have a hydrogen-bonding group.

In addition, the organic base material may contain an additive having a hydrogen-bonding group in addition to the main component constituting the organic base material.

In addition, the organic base material contains a compound that is decomposed by heat or light to generate a hydrogen-bonding group, and may be subjected to a predetermined treatment (for example, light irradiation treatment or heat treatment) to introduce the hydrogen-bonding group on the surface of the organic base material.

The organic base material may have a single-layer structure or a multi-layer structure.

In a case where the organic base material has a multi-layer structure, the organic base material may have a support and an optically anisotropic layer disposed on the support.

Examples of the optically anisotropic layer include an optically anisotropic layer having a phase difference in an in-plane direction and an optically anisotropic layer having a phase difference in a thickness direction.

A thickness of the organic base material is not particularly limited, and is preferably 5 to 200 μm, more preferably 10 to 100 μm, and even more preferably 20 to 90 μm.

<Liquid Crystal Layer>

The liquid crystal layer is a layer disposed on the above organic base material. The liquid crystal layer is a layer obtained by aligning a liquid crystal compound and has optical anisotropy. That is, the liquid crystal layer is an optically anisotropic layer.

As mentioned above, the liquid crystal layer contains a photo-alignment compound. In addition, as mentioned above, the liquid crystal layer may contain a leveling agent.

The liquid crystal layer is preferably a layer to which the aligned liquid crystal compound is fixed. In a case where the liquid crystal compound has a polymerizable group, an alignment state of the liquid crystal compound can be easily fixed by the curing treatment described later.

The "fixed" state is a state in which the alignment of the liquid crystal compound is maintained. More specifically, in general, in a temperature range of 0° C. to 50° C. and, under more severe conditions, in a temperature range of −30° C. to 70° C., a state in which the layer has no fluidity and the fixed alignment form can be maintained stably without causing a change in the alignment form due to an external field or an external force is preferable.

The state in which the liquid crystal compound is aligned (alignment state) is not particularly limited, and examples thereof include known alignment states. Examples of the alignment state include homogeneous alignment and homeotropic alignment. More specifically, in a case where the liquid crystal compound is a rod-like liquid crystal compound, examples of the alignment state include nematic alignment (state in which a nematic phase is formed), smectic alignment (state in which a smectic phase is formed), cholesteric alignment (state in which a cholesteric phase is formed), and hybrid alignment. In a case where the liquid crystal compound is a discotic liquid crystal compound, examples of the alignment state include nematic alignment, columnar alignment (state in which a columnar phase is formed), and cholesteric alignment.

It is preferable that a homogeneously aligned liquid crystal compound is fixed to the surface region on the side of the organic base material in the liquid crystal layer.

First, the surface region on the side of the organic base material in the liquid crystal layer corresponds to the region from the surface of the liquid crystal layer on the side of the organic base material to the depth position (thickness position) equivalent to 20% of the total thickness of the liquid crystal layer toward the side opposite to the side of the organic base material. That is, in a case where the position equivalent to 20% of the total thickness of the liquid crystal layer from the surface of the organic base material of the liquid crystal layer is set as an intermediate position, the region from the surface of the organic base material of the liquid crystal layer to the intermediate position corresponds to the above surface region.

In the present specification, the homogeneous alignment refers to a state (optical uniaxiality) in which molecular axes of the liquid crystal compound (for example, corresponding to a long axis in a case of the rod-like liquid crystal compound) are disposed horizontally and in the same orientation with respect to the layer surface.

Here, "horizontal" is not required to be strictly horizontal, but means that an inclination angle (average tilt angle) formed by an average molecular axis of the liquid crystal compound in the layer with the layer surface is less than 2°.

In addition, the same orientation is not required to be strictly the same orientation, but when the orientations of the slow phase axes are measured at any 20 points in the plane, the same orientation means that a maximum difference of the slow phase axes orientations among the slow phase axes orientations at the 20 points (a difference between two slow phase axes orientations, which is the maximum among the 20 slow phase axes orientations) is less than 10°.

Examples of the method of measuring the alignment state of the liquid crystal compound in the above surface region include methods described in Examples described later.

A thickness of the liquid crystal layer is not particularly limited, but is preferably 0.1 to m, and more preferably 0.5 to 5 μm.

The in-plane retardation of the liquid crystal layer is not particularly limited, but for example, in a case where an optical film is used for an antireflection film application, the in-plane retardation of the liquid crystal layer at a wavelength of 550 nm is preferably 110 to 160 nm.

A content of the photo-alignment compound in the liquid crystal layer is not particularly limited, but from a viewpoint that the effect of the present invention is more excellent, the content is preferably 0.01% to 30% by mass, and more preferably 0.1% to 10% by mass with respect to a total mass of the liquid crystal layer.

The liquid crystal layer is preferably a layer formed of a composition (hereinafter, simply referred to as "composition") containing a liquid crystal compound and a photo-alignment compound.

In the following description, first, the materials constituting the liquid crystal layer will be described in detail.

(Liquid Crystal Compound)

The liquid crystal compound is not particularly limited, and examples thereof include a compound in which any one of homeotropic alignment, homogeneous alignment, hybrid alignment, or cholesteric alignment can be performed.

Here, in general, the liquid crystal compound can be classified into a rod-like type (rod-like liquid crystal compound) and a disk-like type (discotic liquid crystal compound or disk-like liquid crystal compound) depending on the shape thereof. In addition, each type includes a low molecular type and a high molecular type. The term high molecular generally refers to a compound having a degree of polymerization of 100 or more (Polymer Physics-Phase Transition Dynamics, written by Masao Doi, p. 2, published by Iwanami Shoten, 1992). In the present invention, any liquid crystal compound can be used, and a rod-like liquid crystal compound or a discotic liquid crystal compound (disk-like liquid crystal compound) is preferable. In addition, a liquid crystal compound which is a monomer or has a relatively low molecular weight with a degree of polymerization of less than 100 is preferable.

The liquid crystal compound preferably has a polymerizable group. That is, the liquid crystal compound is preferably a polymerizable liquid crystal compound. In addition, examples of the polymerizable group of the polymerizable liquid crystal compound include an acryloyl group, a methacryloyl group, an epoxy group, and a vinyl group.

By polymerizing such a polymerizable liquid crystal compound, the alignment of the liquid crystal compound can be fixed. After fixing of the liquid crystal compound by polymerization, it is no longer necessary to exhibit liquid crystallinity.

As the rod-like liquid crystal compound, for example, those described in claim 1 of JP1999-513019A (JP-H11-513019A) or paragraphs [0026] to [0098] of JP2005-289980A are preferable, and as the discotic liquid crystal compound, for example, those described in paragraphs [0020] to [0067] of JP2007-108732A or paragraphs [0013] to [0108] of JP2010-244038A are preferable.

A liquid crystal compound having reverse wavelength dispersibility can be used as the above polymerizable liquid crystal compound.

Here, in the present specification, the "reverse wavelength dispersible" liquid crystal compound means that in a case where an in-plane retardation (Re) value at a specific wavelength (visible light range) of a phase difference film manufactured using the compound is measured, the Re value is equal or higher as a measurement wavelength is increased.

The liquid crystal compound having reverse wavelength dispersibility is not particularly limited as long as a film having reverse wavelength dispersibility can be formed as described above, and for example, compounds represented by General Formula (I) described in JP2008-297210A (particularly, compounds described in paragraphs [0034] to [0039]), compounds represented by General Formula (1) described in JP2010-084032A (particularly, compounds described in paragraphs [0067] to [0073]), and compounds represented by General Formula (1) described in JP2016-081035A (particularly, compounds described in paragraphs [0043] to [0055]) are considered.

In addition, compounds described in paragraphs [0027] to [0100] of JP2011-006360A, paragraphs [0028] to [0125] of JP2011-006361A, paragraphs [0034] to [0298] of JP2012-207765A, paragraphs [0016] to [0345] of JP2012-077055A, paragraphs [0017] to [0072] of WO12/141245A, paragraphs [0021] to [0088] of WO12/147904A, and paragraphs [0028] to [0115] of WO14/147904A are also considered.

A content of the liquid crystal compound in the composition is not particularly limited, but from a viewpoint that the effect of the present invention is more excellent, the content thereof is preferably 50% by mass or more, more preferably 70% by mass or more, and even more preferably 90% by mass or more, with respect to a total solid content in the composition. An upper limit is not particularly limited, but is 99% by mass or less in many cases.

Here, the solid content in the composition means the component that constitutes the liquid crystal layer and does not include a solvent. In addition, as long as the component is one constituting the liquid crystal layer, the component is regarded as a solid content even in a case where the form thereof is liquid.

(Photo-Alignment Compound)

The photo-alignment compound is a compound having a photo-alignment group.

Here, the "photo-alignment group" refers to a group having a photo-alignment function in which rearrangement or an anisotropic chemical reaction is induced by irradiation with light having anisotropy (for example, plane-polarized light), and from a viewpoint of excellent alignment uniformity and improved thermal stability and chemical stability, a photo-alignment group in which at least one of dimerization or isomerization is caused by the action of light is preferable.

Examples of the photo-alignment group which is dimerized by the action of light include groups having a skeleton of at least one type of derivative selected from the group consisting of cinnamic acid derivatives (M. Schadt et al., J. Appl. Phys., vol. 31, No. 7, page 2155 (1992)), coumarin derivatives (M. Schadt et al., Nature, vol. 381, page 212 (1996)), chalcone derivatives (Toshihiro Ogawa et al., Preprints of Symposium on Liquid Crystals, 2AB03 (1997)), maleimide derivatives, and benzophenone derivatives (Y. K. Jang et al., SID Int. Symposium Digest, P-53 (1997)).

On the other hand, examples of the photo-alignment group which is isomerized by the action of light include groups having a skeleton of at least one type of compound selected from the group consisting of azobenzene compounds (K. Ichimura et al., Mol. Cryst. Liq. Cryst., 298, 221 (1997)), stilbene compounds. (J. G. Victor and J. M. Torkelson, Macromolecules, 20, 2241 (1987)), spiropyran compounds (K. Ichimura et al., Chemistry Letters, page 1063 (1992); K. Ichimura et al., Thin Solid Films, vol. 235, page 101 (1993)), cinnamic acid compounds (K. Ichimura et al., Macromolecules, 30, 903 (1997)), and hydrazono-β-ketoester compounds (S. Yamamura et al., Liquid Crystals, vol. 13, No. 2, page 189 (1993)).

Among these, the photo-alignment group is preferably selected from the group consisting of a cinnamoyl group, an azobenzene group, a carconyl group, and a coumarin group.

From the viewpoint that the effect of the present invention is more excellent, the photo-alignment compound is preferably a polymer.

The photo-alignment compound preferably has a repeating unit having a photo-alignment group.

The structure of a main chain of the repeating unit having a photo-alignment group is not particularly limited, and known structures are considered. For example, a skeleton selected from the group consisting of a (meth)acrylic skeleton, a styrene-based skeleton, a siloxane-based skeleton, a cycloolefin-based skeleton, a methylpentene-based skeleton, an amide-based skeleton, and an aromatic ester-based skeleton is preferable.

Among these, a skeleton selected from the group consisting of a (meth)acrylic skeleton, a siloxane-based skeleton, and a cycloolefin-based skeleton is more preferable, and a (meth)acrylic skeleton is even more preferable.

As the repeating unit having a photo-alignment group, a repeating unit represented by Formula (W) is preferable.

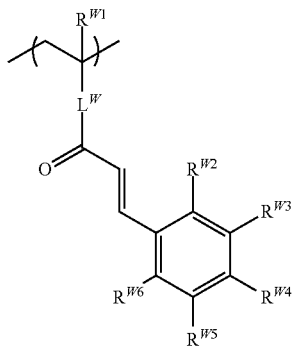

(W)

$R^{w1}$ represents a hydrogen atom or a methyl group.

$L^w$ represents a single bond or a divalent linking group. The preferred embodiment of the divalent linking group is the same as the preferred embodiment of the divalent linking group represented by $L^1$ described later.

$R^{w2}$, $R^{w3}$, $R^{w4}$, $R^{w5}$, and $R^{w6}$ each independently represent a hydrogen atom or a substituent, and among $R^{w2}$, $R^{w3}$, $R^{w4}$, $R^{w5}$, and $R^{w6}$, two adjacent groups may be bonded to each other to form a ring.

The type of the above substituent is not particularly limited, and examples thereof include the groups exemplified by the substituents that the alkyl group represented by $R^1$ described later may have. Among these, an alkoxy group is preferable.

The content of the repeating unit having a photo-alignment group in the photo-alignment compound is not particularly limited, and is preferably 15% to 98% by mass, and more preferably 30% to 95% by mass with respect to all the repeating units of the photo-alignment compound from the viewpoint that the effect of the present invention is more excellent.

The photo-alignment compound preferably has an interacting group selected from the group consisting of a hydrogen-bonding group, a group having a salt structure, a boronic acid group (—B(OH)$_2$), a boronic acid ester group, and a group represented by Formula (1) from the viewpoint that the effect of the present invention is more excellent. In a case where the photo-alignment compound has the above interacting group, the photo-alignment compound tends to interact with the organic base material, and as a result, the photo-alignment compound tends to be unevenly distributed on the side of the organic base material.

(1)

Examples of the hydrogen-bonding group include a hydroxy group, a thiol group, a carboxy group, an amino group, an amide group, a urea group, and a urethane group.

The group having a salt structure is a group having a salt-derived structure including an acid-derived anion and a base-derived cation. Examples of the salt structure include a carboxylate salt structure, a sulfonate salt structure, a phosphonate salt structure, and a quaternary ammonium salt structure.

In Formula (1), $R^1$ represents an alkyl group having 1 to 20 carbon atoms, which may have a substituent. The above alkyl group preferably has 1 to 10 carbon atoms, and more preferably has 1 to 5 carbon atoms.

The type of the substituent is not particularly limited, and examples thereof include known substituents. Examples of the substituent include an alkyl group, an alkenyl group, an alkynyl group, an aryl group, an amino group, an alkoxy group, an aryloxy group, an aromatic heterocyclic oxy group, an acyl group, an alkoxycarbonyl group, an aryloxycarbonyl group, an acyloxy group, an acylamino group, an alkoxycarbonylamino group, an aryloxycarbonylamino group, a sulfonylamino group, a sulfamoyl group, a carbamoyl group, an alkylthio group, an arylthio group, an aromatic heterocyclic thio group, a sulfonyl group, a sulfinyl group, a ureide group, a phosphoric acid amide group, a hydroxy group, a mercapto group, a halogen atom, a cyano group, a sulfo group, a carboxy group, a nitro group, a hydroxamic acid group, a sulfino group, a hydrazino group, an imino group, a heterocyclic group (for example, a heteroaryl group), a silyl group, and a group formed by combination of these groups. Further, the above substituent may further be substituted with a substituent.

In a case where $R^1$ is an alkyl group having 2 to 20 carbon atoms, one or more of —CH$_2$— constituting the alkyl group may be substituted with —O—, —S—, —N(Q)—, —CO—O—, —O—CO—, or —CO—.

Q represents a substituent. The type of the substituent is not particularly limited, and examples thereof include known substituents, and examples thereof include the groups exemplified by the substituents that the alkyl group represented by $R^1$ may have.

* represents a bonding position.

The photo-alignment compound preferably contains a repeating unit having an interacting group from the viewpoint that the effect of the present invention is more excellent.

Among these, the photo-alignment compound preferably contains at least one of the repeating units represented by Formulae (2) to (6). Among these, from the viewpoint that the effect of the present invention is more excellent, the photo-alignment compound preferably contains a repeating unit represented by Formula (2), a repeating unit represented by Formula (3), or a repeating unit represented by Formula (6).

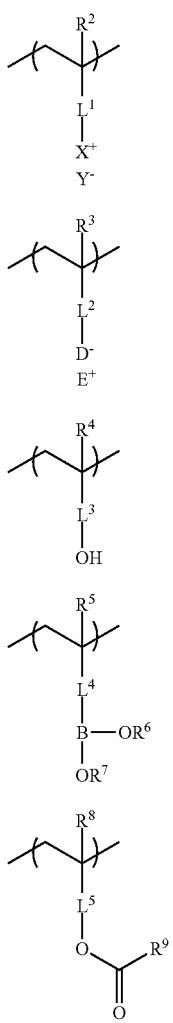

$R^2$, $R^3$, $R^4$, $R^5$, and $R^8$ each independently represent a hydrogen atom or an alkyl group having 1 to 20 carbon atoms, which may have a substituent.

The alkyl group preferably has 1 to 10 carbon atoms, and more preferably has 1 to 5 carbon atoms.

The alkyl group may be linear, may be branched, may be cyclic, or may have a structure in which these are combined.

The type of the substituent that the alkyl group may have is not particularly limited, and examples thereof include known substituents, and examples thereof include the groups exemplified by the substituents that the alkyl group represented by $R^1$ may have.

$L^1$, $L^2$, $L^3$, $L^4$, and $L^5$ each independently represent a single bond or a divalent linking group. The divalent linking group is not particularly limited, and examples of the divalent linking group include a divalent hydrocarbon group which may have a substituent (for example, a divalent aliphatic hydrocarbon group such as an alkylene group having 1 to 10 carbon atoms, an alkenylene group having 1 to 10 carbon atoms, and an alkynylene group having 1 to 10 carbon atoms, and a divalent aromatic hydrocarbon group such as an arylene group), a divalent heterocyclic group that may have a substituent, —O—, —S—, —NH—, —N($R^a$)—, —CO—, or a group formed by combination of these groups (for example, —CO—O—, —O-divalent hydrocarbon group-, —(O-divalent hydrocarbon group)$_m$—O— (m represents an integer of 1 or more), -divalent hydrocarbon group-O—CO—, and —CO—O-divalent hydrocarbon group-O-divalent hydrocarbon group-CO—O-divalent hydrocarbon group-, and the like). $R^a$ represents a hydrogen atom or an alkyl group.

The type of the substituent that the divalent hydrocarbon group and the divalent heterocyclic group may have is not particularly limited, and examples thereof include known substituents and include groups exemplified by substituents that an alkyl group represented by $R^4$ may have.

$X^+$ represents a cation group. A cation group is a group having a positive charge. The cation group is not particularly limited, and examples thereof include a quaternary ammonium group and a pyridinium group. Among these, a quaternary ammonium group is preferable.

$Y^-$ represents an anion. The type of anion is not particularly limited, and examples thereof include known anions. Examples thereof include inorganic anions such as halogen ions ($F^-$, $Cl^-$, $Br^-$, $I^-$), $NO_3^-$, $ClO_4^-$, $BF_4^-$, $CO_3^{2-}$, and $SO_4^{2-}$, $CH_3OSO_3^-$, $C_2H_5OSO_3^-$, acetic acid, malonic acid, succinic acid, maleic acid, fumaric acid, p-toluenesulfonic acid, and organic anions including organic acid residues such as trifluoroacetic acid. Among these, halogen ions are preferable from the viewpoint that the effect of the present invention is more excellent.

$D^-$ represents an anionic group. An anionic group is a group having a negative charge. The anionic group is not particularly limited, and examples thereof include —COO— and —$SO_3^-$.

$E^+$ represents a cation. The type of cation is not particularly limited, and examples thereof include inorganic cations such as lithium ion, sodium ion, magnesium ion, potassium ion, calcium ion, and aluminum ion, organic ammonium cation, organic sulfonium cation, organic iodine cation, and organic cations such as organic phosphonium cations. Among these, the organic cation is preferable from the viewpoint that the effect of the present invention is more excellent.

$R^6$ and $R^7$ each independently represent a hydrogen atom, an alkyl group which may have a substituent, an aryl group which may have a substituent, or a heteroaryl group which may have a substituent, and any one of $R^6$ or $R^7$ is a hydrogen atom.

The number of carbon atoms in the alkyl group is not particularly limited, and is preferably 1 to 10, and more preferably 1 to 5.

The alkyl group may be linear, may be branched, may be cyclic, or may have a structure in which these are combined.

The aryl group may have a monocyclic structure or a polycyclic structure.

A hetero atom contained in the heteroaryl group is not particularly limited, and examples thereof include an oxygen atom, a nitrogen atom, and a sulfur atom.

The type of the substituent that the above groups (alkyl group, aryl group, heteroaryl group) may have is not particularly limited, examples thereof include known substituents, and include groups exemplified by the substituents that the alkyl group represented by $R^1$ may have.

$R^9$ represents an alkyl group having 1 to 20 carbon atoms.

The alkyl group preferably has 1 to 10 carbon atoms, and more preferably has 1 to 5 carbon atoms.

The alkyl group may be linear, may be branched, may be cyclic, or may have a structure in which these are combined.

The type of the substituent is not particularly limited, and examples thereof include known substituents, and examples thereof include the groups exemplified by the substituents that the alkyl group represented by $R^1$ may have.

In a case where $R^9$ is an alkyl group having 2 to 20 carbon atoms, one or more of —$CH_2$— constituting the alkyl group may be substituted with —O—, —S—, —N(Q)—, —CO—O—, —O—CO—, or —CO—.

Q represents a substituent. The type of the substituent is not particularly limited, and examples thereof include known substituents, and examples thereof include the groups exemplified by the substituents that the alkyl group represented by $R^1$ may have.

* represents a bonding position.

From the viewpoint that the effect of the present invention is more excellent, the photo-alignment compound preferably has at least one of the repeating units represented by Formulae (7) to (9).

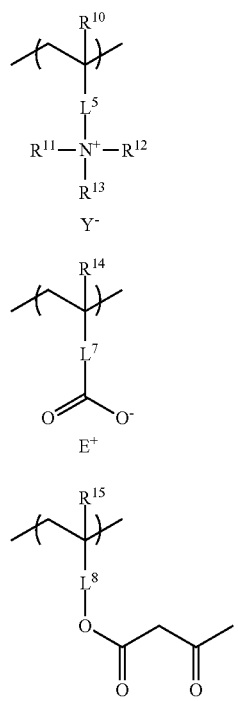

$R^{10}$, $R^{14}$, and $R^{15}$ each independently represent a hydrogen atom or an alkyl group having 1 to 20 carbon atoms, which may have a substituent.

The above alkyl group preferably has 1 to 10 carbon atoms, and more preferably has 1 to 5 carbon atoms.

The alkyl group may be linear, may be branched, may be cyclic, or may have a structure in which these are combined.

The type of the substituent that the alkyl group may have is not particularly limited, and examples thereof include known substituents, and examples thereof include the groups exemplified by the substituents that the alkyl group represented by $R^1$ may have.

$L^6$, $L^7$, and $L^8$ each independently represent a single bond or a divalent linking group. Examples of the divalent linking group include the groups exemplified by the divalent linking group represented by $L^1$, $L^2$, $L^3$, $L^4$, and $L^5$ described above.

$Y^-$ represents an anion. $Y^-$ in Formula (7) is synonymous with $Y^-$ in Formula (2).

$E^+$ represents a cation. $E^+$ in Formula (8) is synonymous with $E^+$ in Formula (3).

$R^{11}$, $R^{12}$, and $R^{13}$ each independently represent a hydrogen atom or an alkyl group having 1 to 20 carbon atoms, which may have a substituent.

The above alkyl group preferably has 1 to 10 carbon atoms, and more preferably has 1 to 5 carbon atoms.

The alkyl group may be linear, may be branched, may be cyclic, or may have a structure in which these are combined.

The type of the substituent that the alkyl group may have is not particularly limited, and examples thereof include known substituents, and examples thereof include the groups exemplified by the substituents that the alkyl group represented by $R^1$ may have.

A content of the repeating unit having an interacting group in the photo-alignment compound is not particularly limited, and is preferably 2% to 85% by mass, and more preferably 5% to 70% by mass with respect to all the repeating units of the photo-alignment compound from the viewpoint that the effect of the present invention is more excellent.

The photo-alignment compound preferably contains the repeating unit having a photo-alignment group and the repeating unit having an interacting group, described above.

The photo-alignment compound may contain other repeating units other than the repeating unit having a photo-alignment group and the repeating unit having an interacting group.

Other repeating units include repeating units having a polymerizable group. Examples of the polymerizable group include a radically polymerizable group and a cationically polymerizable group. Examples of the radically polymerizable group include an acryloyl group and a methacryloyl group, and examples of the cationically polymerizable group include an epoxy group and an oxetanyl group.

In a case where the photo-alignment compound contains a repeating unit having a polymerizable group, the content of the repeating unit having a polymerizable group in the photo-alignment compound is not particularly limited, but from the viewpoint that the effect of the present invention is more excellent, the content of the repeating unit having a polymerizable group is preferably 20% to 80% by mass, and more preferably 30% to 70% by mass with respect to all the repeating units in the photo-alignment compound.

Examples of other repeating units include a repeating unit having a photo-alignment group, a repeating unit having an interacting group, and a repeating unit having an alkyl group, which is different from any of the repeating units having a polymerizable group.

The number of carbon atoms in the alkyl group is not particularly limited, and is preferably 1 to 20, and more preferably 1 to 15.

The alkyl group may be linear, may be branched, may be cyclic, or may have a structure in which these are combined. A cyclic alkyl group is preferable, from a viewpoint that the relaxation of alignment of the photo-alignment compound can be suppressed due to heat. Examples of the cyclic alkyl group include adamantane and the like.

In a case where the photo-alignment compound contains the above repeating unit having an alkyl group, the content of the repeating unit having an alkyl group in the photo-alignment compound is not particularly limited, but from the viewpoint that the effect of the present invention is more excellent, the content of the repeating unit having an alkyl group is preferably 20% to 80% by mass, and more preferably 30% to 70% by mass, with respect to all the repeating units in the photo-alignment compound.

In a case where the photo-alignment compound is a polymer, a weight average molecular weight (Mw) of the photo-alignment compound is not particularly limited, but is preferably 10,000 to 500,000, and more preferably 20,000 to 300,000 from the viewpoint that the effect of the present invention is more excellent.

The weight average molecular weight and the number-average molecular weight in the present invention are values measured by gel permeation chromatography (GPC) under the following conditions.

Solvent (eluent): Tetrahydrofuran (THF)
Device name: TOSOH HLC-8320GPC
Column: Three items of TOSOH TSKgel Super HZM-H (4.6 mm×15 cm) are connected and used.
Column temperature: 40° C.
Sample concentration: 0.1% by mass
Flow rate: 1.0 ml/min
Calibration curve: A calibration curve obtained using seven TSK standard polystyrene samples, manufactured by TOSOH Corporation, in a range of Mw=2, 800,000 to 1,050 (Mw/Mn=1.03 to 1.06) is used.

The photo-alignment compound can be synthesized by a known method.

The content of the photo-alignment compound in the composition is not particularly limited, but from the viewpoint that the effect of the present invention is more excellent, the content is preferably 0.01% to 30% by mass, and more preferably 0.1% to 10% by mass with respect to the content (total mass of the liquid crystal compound) of the liquid crystal compound in the composition.

(Other Components)

The composition may contain compounds other than the liquid crystal compound and the photo-alignment compound, described above.

The composition may include a leveling agent.

The leveling agent preferably has a fluorine atom or a silicon atom. That is, as the leveling agent, a fluorine-based leveling agent or a silicon-based leveling agent is preferable, and a fluorine-based leveling agent is more preferable.

Specific examples of the leveling agent include the compounds represented by General Formula (I) described in paragraphs [0079] to [0102] of JP2007-069471A and described in JP2013-047204A, the compound represented by General Formula (I) described in JP2012-211306A, a liquid crystal alignment promoter represented by General Formula (I) described in JP2002-129162A, and the compound represented by General Formula (I), (II), or (III) described in JP2005-099248A.

A content of the leveling agent in the composition is preferably 0.01% to 5% by mass, and more preferably 0.05% to 1% by mass, with respect to the total solid content of the composition.

The composition may include a polymerization initiator. The polymerization initiator to be used is selected according to the form of a polymerization reaction, and examples thereof include a thermal polymerization initiator and a photopolymerization initiator. Examples of the photopolymerization initiator include an α-carbonyl compound, an acyloin ether, an α-hydrocarbon substituted aromatic acyloin compound, a polynuclear quinone compound, and a combination of a triarylimidazole dimer and a p-aminophenyl ketone.

A content of the polymerization initiator in the composition is preferably 0.01% to 20% by mass, and more preferably 0.3% to 10% by mass with respect to the total solid content of the composition.

The composition may include a thermal acid generator. In particular, in a case where the photo-alignment compound has a cationically polymerizable group, a liquid crystal layer having excellent heat resistance can be obtained by polymerizing the cationically polymerizable group using a thermal acid generator when forming a liquid crystal layer.

The content of the thermal acid generator in the composition is preferably 0.01% to 20% by mass, and more preferably 0.3% to 10% by mass, with respect to the total solid content of the composition.

In addition, the composition may include a polymerizable monomer.

Examples of the polymerizable monomer include a radically polymerizable or cationically polymerizable compound. Among these, a polyfunctional radically polymerizable monomer is preferable. In addition, as the polymerizable monomer, a monomer which is copolymerizable with the above liquid crystal compound having a polymerizable group is preferable. Examples of the polymerizable monomer include those described in paragraphs [0018] to [0020] of JP2002-296423A.

The content of the polymerizable monomer in the composition is preferably 1% to 50% by mass, and more preferably 2% to 30% by mass, with respect to the total mass of the liquid crystal compound in the composition.

Furthermore, the composition may include a solvent. As the solvent, an organic solvent is preferable. Examples of the organic solvent include an amine (for example, diisopropylethylamine) an amide (for example, N,N-dimethylformamide), a sulfoxide (for example, dimethyl sulfoxide), a heterocyclic compound (for example, pyridine, 1,3-dioxolane), a hydrocarbon (for example, benzene and hexane), an alkyl halide (for example, chloroform and dichloromethane), an ester (for example, methyl acetate, ethyl acetate, and butyl acetate), a ketone (for example, acetone and methyl ethyl ketone), and an ether (for example, tetrahydrofuran and 1,2-dimethoxyethane). In addition, two or more kinds of the organic solvents may be used in combination.

Moreover, the composition may include various alignment control agents such as a vertical alignment agent and a horizontal alignment agent. Such an alignment control agent is a compound which is capable of controlling the horizontal or vertical alignment of a liquid crystal compound at an interface.

In addition, the composition may include a polymerization inhibitor, an adhesion improver, and a plasticizer, in addition to the above components.

In particular, the composition for forming a liquid crystal layer may contain a polymerization inhibitor for the purpose of suppressing the polymerization of the liquid crystal compound in step 2 described later.

<Method of Forming Liquid Crystal Layer>

A method of forming a liquid crystal layer is not particularly limited as long as the liquid crystal layer is formed of the above composition and the photo-alignment compound can be unevenly distributed on the side of the organic base material as described above.

Among these, in a case where the above-mentioned polymerizable liquid crystal compound and the photo-alignment compound having an interacting group are used, a predetermined optical film can be produced with high productivity.

More specifically, a production method having the following steps 1 to 3 is preferable.

Step 1: A step of applying a composition containing a polymerizable liquid crystal compound and a photo-alignment compound having an interacting group on an organic base material to form a coating film Step 2: A step of irradiating the formed coating film with polarized light Step 3: A step of aligning the polymerizable liquid crystal compound in the coating film obtained in step 2 and then performing a curing treatment to form a liquid crystal layer Hereinafter, the procedure of Steps 1 to 3 will be described in detail.

(Step 1)

Step 1 is a step of applying a composition containing a polymerizable liquid crystal compound and a photo-alignment compound having an interacting group on an organic base material to form a coating film. By performing the present step, an interaction occurs between the interacting group in the photo-alignment compound having an interacting group and the organic base material, and the photo-alignment compound tends to be unevenly distributed on the side of the organic base material in the coating film.

The composition to be used is as described above.

In addition, the organic base material to be used is as described above.

A method of applying the composition on the organic base material is not particularly limited, and examples thereof include a curtain coating method, a dip coating method, a spin coating method, a printing coating method, a spray coating method, a slot coating method, a roll coating method, a slide coating method, a blade coating method, a gravure coating method, and a wire bar coating method.

The coating film may be heat-treated after the coating film is formed and before the step 2 described later. By performing the heat treatment, the photo-alignment compound tends to be unevenly distributed on the side of the organic base material.

As the heating condition during the heat treatment, the heating temperature is preferably 50° C. to 250° C., more preferably 50° C. to 150° C., and the heating time is preferably 10 seconds to 10 minutes from the viewpoint that the effect of the present invention is more excellent.

(Step 2)

Step 2 is a step of irradiating the formed coating film with polarized light. By irradiating with polarized light, the photo-alignment compound unevenly distributed in the coating film is aligned in a predetermined direction, and a part of the region in the coating film can function as a photo-alignment film.

Polarized light radiated to the coating film is not particularly limited, examples thereof include linearly polarized light, circularly polarized light, and elliptically polarized light, and linearly polarized light is preferable.

A wavelength of polarized light is not particularly limited, and examples thereof include ultraviolet rays, near ultraviolet rays, and visible light. Among these, near ultraviolet rays of 250 nm to 450 nm are preferable.

In addition, examples of the light source for the irradiation with polarized light include a xenon lamp, a high-pressure mercury lamp, an extra-high-pressure mercury lamp, and a metal halide lamp. By using an interference filter, a color filter, or the like with respect to ultraviolet rays or visible rays obtained from the light source, the wavelength range of the irradiation can be restricted. In addition, linearly polarized light can be formed of a polarization filter or a polarization prism with respect to the light from the light source.

The irradiation direction of the polarized light is not particularly limited, and the irradiation may be performed from the side of the coating film or the side of the organic base material. Irradiation from the side of the organic base material is preferable from a viewpoint that the effect of the present invention is more excellent.

The integrated quantity of the polarized light is not particularly limited, and is preferably 1 to 300 mJ/cm$^2$, and more preferably 2 to 100 mJ/cm$^2$.

(Step 3)

Step 3 is a step of aligning the polymerizable liquid crystal compound in the coating film obtained in step 2 and then performing a curing treatment to form a liquid crystal layer. By performing the present step, the polymerizable liquid crystal compound is aligned based on the alignment-regulating force of the photo-alignment compound aligned in a predetermined direction obtained in step 2, and is cured with respect to the aligned polymerizable liquid crystal compound to form a liquid crystal layer obtained by fixing the aligned liquid crystal compound.

Examples of the method of aligning the polymerizable liquid crystal compound include heat treatment.

The condition in a case of heating the coating film is not particularly limited, but the heating temperature is preferably 50° C. to 250° C., and more preferably 50° C. to 150° C., and the heating time is preferably 10 seconds to 10 minutes.

In addition, after being heated, the coating film may be cooled, depending on the necessity, before the curing treatment described later. The cooling temperature is preferably 20° C. to 200° C., and more preferably 30° C. to 150° C.

Next, the coating film in which the polymerizable liquid crystal compound has been aligned is subjected to a curing treatment.

A method of the curing treatment to be carried out on the coating film in which the polymerizable liquid crystal compound has been aligned is not particularly limited, and examples thereof include a light irradiation treatment and a heating treatment. Among those, from the viewpoint of manufacturing suitability, the light irradiation treatment is preferable, and an ultraviolet ray irradiation treatment is more preferable.

An irradiation condition for the light irradiation treatment is not particularly limited, but an irradiation dose of 50 to 1,000 mJ/cm$^2$ is preferable.

The atmosphere during the light irradiation treatment is not particularly limited, but a nitrogen atmosphere is preferable.

By carrying out the above procedure of steps 1 to 3, an optical film in which the photo-alignment compound is unevenly distributed on the side of the organic base material in the liquid crystal layer can be obtained.

In a case where the composition used in the above step 1 contains a leveling agent, the leveling agent is unevenly distributed on the side opposite to the side of the organic base material of the formed liquid crystal layer.

That is, the liquid crystal layer formed in the optical film in a case where the composition contains a leveling agent has two main surfaces formed of the composition containing the liquid crystal compound, the photo-alignment compound, and the leveling agent. This corresponds to a liquid crystal film in which the leveling agent is unevenly distributed on one main surface side and the photo-alignment compound is unevenly distributed on the other main surface side in the liquid crystal film.

In the above liquid crystal film, the fact that the photo-alignment compound is unevenly distributed on the other main surface side corresponds to the fact that the uneven distribution degree calculated by the uneven distribution degree calculation method 3 described later is 2.0 or more.

Uneven distribution calculation method 3: in a case where, among two main surfaces of the liquid crystal film, a main surface on a side where the leveling agent is unevenly distributed is denoted as a main surface A, and the other main surface is denoted as a main surface B, in a case where a secondary ion intensity derived from the photo-alignment compound in the liquid crystal film is measured by time-of-flight secondary ion mass spectrometry while emitting an ion beam from the main surface A toward the side of the main surface B of the liquid crystal film, in a case where a region from the main surface A of the liquid crystal film to a depth position equivalent to 80% of a total thickness of the liquid crystal film toward the side of the main surface B is denoted as an upper layer region, and a region from the depth position (depth position equivalent to 80% of the total thickness of the liquid crystal film) to the main surface B of the liquid crystal film is denoted as a lower layer region, a ratio ($I_{C1}/I_{C2}$) of a maximum value $I_{C1}$ of the secondary ion intensity derived from the photo-alignment compound in the lower layer region to an average value $I_{C2}$ of the secondary ion intensity derived from the photo-alignment compound in the upper layer region is denoted as an uneven distribution degree.

In the above uneven distribution degree calculation method 3, while emitting an ion beam, from one of the two main surfaces of the liquid crystal film (hereinafter, also simply referred to as "main surface X") toward the other main surface (hereinafter, also simply referred to as "main surface Y"), the secondary ion intensity derived from the leveling agent in the liquid crystal layer and the secondary ion intensity derived from the photo-alignment compound are measured by time-of-flight secondary ion mass spectrometry (TOF-SIMS). Examples of the type of ion beam include an ion beam using an argon gas cluster ion gun (Ar-GCIB gun).

Next, in a case where a region from the main surface X to the depth position equivalent to 20% of the total thickness of the liquid crystal film (hereinafter, also referred to as "depth position MX") toward the side of the main surface Y is denoted as an upper layer region X, and a region from the depth position MX to the main surface Y is denoted as a lower layer region X, a ratio ($I_{X1}/I_{X2}$) of a maximum value $I_{X1}$ of a secondary ion intensity derived from the leveling agent in the upper layer region X to an average value $I_{X2}$ of the secondary ion intensity derived from the leveling agent in the lower layer region X is obtained.

In addition, in a case where the region from the main surface Y to the depth position (hereinafter, also referred to as "depth position MY") equivalent to 20% of the total thickness of the liquid crystal film toward the side of the main surface X is denoted as the upper layer region Y, and a region from the depth position MY to the main surface X is denoted as a lower layer region Y, a ratio ($I_{Y1}/I_{Y2}$) of a maximum value $I_{Y1}$ of the secondary ion intensity derived from the leveling agent in the upper layer region Y to the average value $I_{Y2}$ of the secondary ion intensity derived from the leveling agent in the lower layer region Y is obtained.

When the obtained ratio ($I_{X1}/I_{X2}$) and the ratio ($I_{Y1}/I_{Y2}$) are compared with each other, in a case where the ratio ($I_{X1}/I_{X2}$) is greater, the main surface X is denoted as a main surface A which is a main surface on a side where the leveling agent is unevenly distributed, and in a case where the ratio ($I_{Y1}/I_{Y2}$) is greater, the main surface Y is denoted as a main surface A which is a main surface on a side where the leveling agent is unevenly distributed.

After the main surface A is determined by the above procedure, the ratio ($I_{C1}/I_{C2}$) is calculated according to the procedure of the above-mentioned uneven distribution degree calculation method 3.

It is shown that the greater the ratio ($I_{C1}/I_{C2}$) is, the more the photo-alignment compound is unevenly distributed on side of the other main surface.

From the viewpoint that the effect of the present invention is more excellent, the ratio ($I_{C1}/I_{C2}$) is preferably 3.5 or more, and more preferably 5.0 or more. An upper limit is not particularly limited, but is 30.0 or less in many cases, and 20.0 or less in more cases.

In the liquid crystal film, the fact that the leveling agent is unevenly distributed on one main surface side corresponds to the fact that the uneven distribution degree calculated by the uneven distribution degree calculation method 4 described later is 2.0 or more.

Uneven distribution calculation method 4: while emitting an ion beam from one main surface (hereinafter, also simply referred to as "main surface X") of two main surfaces of the liquid crystal film to a side of the other main surface (hereinafter, also simply referred to as "main surface Y"), a secondary ion intensity derived from a leveling agent in the liquid crystal film is measured by time-of-flight secondary ion mass spectrometry. Next, in a case where a region from the main surface X to a depth position (hereinafter, referred to as "depth position MX") equivalent to 20% of the total thickness of the liquid crystal layer toward the side of the main surface Y is denoted as an upper layer region X, and a region from the depth position MX to the main surface Y is denoted as a lower layer region X, a ration ($I_{X1}/I_{X2}$) of a maximum value $I_{X1}$ of a secondary ion intensity derived from the leveling agent in the upper layer region X to an average value $I_{X2}$ of the secondary ion intensity derived from the leveling agent in the lower layer region X is obtained. In addition, in a case where the region from the main surface Y to the depth position (hereinafter, also referred to as "depth position MY") equivalent to 20% of the total thickness of the liquid crystal layer toward the main surface X side is denoted as an upper layer region Y, and a region from the depth position MY to the main surface X is denoted as a lower layer region Y, a ratio ($I_{Y1}/I_{Y2}$) of a maximum value $I_{Y1}$ of the secondary ion intensity derived from the leveling agent in the upper layer region Y to an average value $I_{Y2}$ of the secondary ion intensity derived from the leveling agent in the lower layer region Y is obtained. When the obtained ratio ($I_{X1}/I_{X2}$) and the ratio ($I_{Y1}/I_{Y2}$) are compared with each other, in a case where the ratio ($I_{X1}/I_{X2}$) is greater, the main surface X is denoted as a main surface A which is a main surface on a side where the leveling agent is unevenly distributed and the ratio ($I_{X1}/I_{X2}$) is denoted as an uneven distribution degree, and in a case where the ratio ($I_{Y1}/I_{Y2}$) is greater, the main surface Y is denoted as a main surface A which is a main surface on a side where the leveling agent is unevenly distributed and the ratio ($I_{Y1}/I_{Y2}$) is denoted as an uneven distribution degree.

It is shown that the greater the uneven distribution degree, the more the leveling agent is unevenly distributed on the side of one main surface.

From the viewpoint that the effect of the present invention is more excellent, the uneven distribution degree is preferably 30.0 or more, and more preferably 60.0 or more. An upper limit is not particularly limited, but is 300.0 or less in many cases, and 150.0 or less in more cases.

The liquid crystal film has the same constitution as the liquid crystal layer shown in FIG. 1 described above, and the description thereof will be omitted.

In addition, the liquid crystal layer and the liquid crystal film in the optical film according to the embodiment of the present invention are less likely to have film thickness irregularity caused by dry air during formation. More specifically, in the liquid crystal layer or the liquid crystal film in the optical film according to the embodiment of the present invention, the film thickness irregularity caused by the dry air when forming the liquid crystal layer from the predetermined coating film is unlikely to occur. Hereinafter, the above-mentioned film thickness irregularity is also referred to as "wind irregularity".

The optical film according to the embodiment of the present invention may further have the other optically anisotropic layer on the liquid crystal layer (on the surface of the liquid crystal layer on a side opposite to the organic base material) described above.

As the other optically anisotropic layer, an optically anisotropic layer formed of a polymerizable liquid crystal composition containing a polymerizable liquid crystal compound is preferable. Here, examples of the polymerizable liquid crystal compound contained in the polymerizable liquid crystal composition for forming the other optically anisotropic layer include the polymerizable liquid crystal compound used for forming the above-mentioned liquid crystal layer. In addition, the polymerizable liquid crystal composition for forming the other optically anisotropic layer may be used for forming the above-mentioned liquid crystal layer, and may contain other components other than a leveling agent, a polymerization initiator, a polymerizable monomer, a solvent, and an alignment control agent, and an adhesion improver.

The liquid crystal layer may be surface-treated before the other optically anisotropic layer described above is formed on the liquid crystal layer. Examples of the surface treatment include glow discharge treatment, corona discharge treatment (corona treatment), and ultraviolet (UV) treatment, and corona treatment is preferable from a viewpoint of enhancing aligning properties of the other optically anisotropic layer. Examples of the corona treatment method include methods as shown in JP1993-140355A (JP-H05-140355A).

As the other optically anisotropic layer, an optically anisotropic layer having a phase difference in the thickness direction is preferable from a viewpoint that light leakage in an oblique direction when the optical film is applied as a viewing angle compensating plate for a liquid crystal cell can be reduced. The retardation in the thickness direction of the optically anisotropic layer having a phase difference in the thickness direction is not particularly limited, but the retardation in the thickness direction at a wavelength of 550 nm is preferably −10 to 160 nm, and more preferably −20 to −130 nm from the viewpoint that light leakage in an oblique direction when the optical film is applied as a viewing angle compensating plate for a liquid crystal cell can be reduced.

The thickness of the other optically anisotropic layer is not particularly limited, and is preferably 0.1 to 10 μm, and more preferably 0.1 to 5 μm.

<Use>

The optical film and the liquid crystal film can be applied to various uses. For example, an image display device including a display element and an optical film or a liquid crystal film can be exemplified. In addition, the image display device may be as an image display device including a display element and a liquid crystal layer obtained by transferring the liquid crystal layer of the optical film onto the display element to peel off the organic base material.

The display element which is used in the image display device according to the embodiment of the present invention is not particularly limited, and examples thereof include a liquid crystal cell, an organic electroluminescence (hereinafter, abbreviated as "EL") display panel, and a plasma display panel, and the liquid crystal cell or the organic EL display panel are preferable. That is, the image display device according to the embodiment of the present invention is preferably a liquid crystal display device using a liquid crystal cell as a display element or an organic EL display device using an organic EL display panel as a display element.

The liquid crystal cell used for the liquid crystal display device is preferably a vertical alignment (VA) mode, an optically compensated bend (OCB) mode, an in-plane-switching (IPS) mode, or a twisted nematic (TN) mode.

As the liquid crystal display device which is an example of the image display device according to the embodiment of the present invention, for example, it is preferable to have a polarizer, an optical film (or a liquid crystal layer, a liquid crystal film), and a liquid crystal cell in this order from the viewing side, and it is more preferable to have the polarizer, the above-mentioned other optically anisotropic layer (preferably an optically anisotropic layer having a phase difference in the thickness direction), the above-mentioned liquid crystal layer (preferably an optically anisotropic layer having a phase difference in the in-plane direction), and the liquid crystal cell in this order from the viewing side.

The organic EL display device which is an example of the image display device according to the embodiment of the present invention preferably has a polarizer, an optical film (or liquid crystal layer, liquid crystal film), and an organic EL display panel in this order from the viewing side, for example.

The polarizer is not particularly limited as long as the polarizer is a member having a function of converting light into specific linearly polarized light, and the known absorption-type polarizer and a reflective-type polarizer in the related art can be used.

As the absorption-type polarizer, an iodine-based polarizer, a dye-based polarizer using a dichroic dye, a polyene-based polarizer, and the like are used. The iodine-based polarizer and the dye-based polarizer include a coating-type polarizer and a stretching-type polarizer, and any of these is applicable.

In addition, examples of a method of obtaining a polarizer by carrying out stretching and dyeing in a state of a laminated film in which a polyvinyl alcohol layer is formed on a base material include the methods described in JP5048120B, JP5143918B, JP4691205B, JP4751481B, and JP4751486B, and known technologies relating to these polarizers can also be preferably used.

Examples of the reflective-type polarizer include a polarizer obtained by laminating thin films having different birefringences, a wire grid-type polarizer, and a polarizer obtained by combining a cholesteric liquid crystal having a selective reflection area and a ¼ wavelength plate.

Among these, from a viewpoint of more excellent adhesiveness, a polarizer including a polyvinyl alcohol-based resin (a polymer containing —$CH_2$—CHOH— as a repeating unit, particularly, at least one selected from the group consisting of a polyvinyl alcohol and an ethylene-vinyl alcohol copolymer) is preferable.

A thickness of the polarizer is not particularly limited and is preferably 3 to 60 μm and more preferably 5 to 30 μm.

The organic EL display panel is a member in which a light emitting layer or a plurality of organic compound thin films including a light emitting layer are formed between a pair of electrodes of an anode and a cathode. The organic EL display panel may have a hole injection layer, a hole transport layer, an electron injection layer, an electron transport layer, a protective layer, and the like in addition to the light emitting layer, and each of these layers may have other functions.

EXAMPLES

Hereinafter, the present invention will be described in more detail with reference to Examples. The materials, the amounts of materials used, the proportions, the treatment details, the treatment procedure, and the like shown in Examples below can be appropriately modified as long as the modifications do not depart from the spirit of the present invention. Accordingly, the scope of the present invention is not limited to the following examples.

(Synthesis of Monomer mA-1)

In a 2 L three-necked flask equipped with a stirring blade, a thermometer, a dropping funnel, and a reflux tube, trans-1,4-cyclohexanediol (50.0 g), triethylamine (48.3 g), and N,N-dimethylacetamide (800 g) were added, and the obtained mixed solution was stirred under ice-cooling.

Next, methacrylic acid chloride (47.5 g) was added dropwise to the flask over 40 minutes using a dropping funnel, and after completion of the dropwise addition, the reaction solution was stirred at 40° C. for 2 hours.

The reaction solution was cooled to room temperature (23° C.), and then the reaction solution was absorption-filtered to remove the precipitated salt. The obtained filtrate was transferred to a 2 L three-necked flask equipped with a stirring blade, a thermometer, a dropping funnel, and a reflux tube, and stirred under water cooling.

Next, N, N-dimethylaminopyridine (10.6 g) and triethylamine (65.9 g) were added to the flask, and 4-methoxycinnamic acid chloride (127.9 g) previously dissolved in tetrahydrofuran (125 g) was added dropwise into the flask over 30 minutes using a dropping funnel. After completion of the dropwise addition, the reaction solution was stirred at 50° C. for 6 hours. The reaction solution was cooled to room temperature, and then washed separately with water, and the obtained organic phase was dried over anhydrous magnesium sulfate. Magnesium sulfate was separated by filtration, and the obtained solution was concentrated to obtain a yellowish white solid.

The obtained yellowish white solid was dissolved in methyl ethyl ketone (400 g) by heating and recrystallized to obtain 76 g of a monomer mA-1 shown below as a white solid (yield 40%). In addition, Me represents a methyl group.

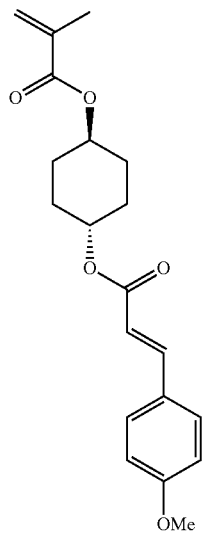

mA-1

(Synthesis of Monomer mA-2)

A monomer mA-2 was synthesized by the same procedure as the above (synthesis of monomer mA-1) except that the raw material trans-1,4-cyclohexanediol was replaced with trans-4-aminocyclohexanol and 4-methoxycinnamic acid chloride was replaced with 4-n-octyloxycinnamic acid chloride.

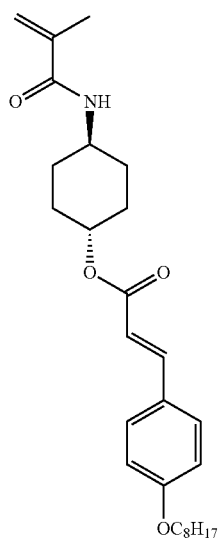

mA-2

(Synthesis of Monomer mC-1c)

After adding hydroxyethyl methacrylate (100.0 g) and dimethylacetamide (600 mL) to a 3 L three-necked flask equipped with a stirring blade, a thermometer, a dropping funnel, and a reflux tube, while stirring the obtained mixed solution at 0° C., 3-chloropropionic acid chloride (126.6 g) was added dropwise to the flask and reacted at room temperature for 3 hours.

Ethyl acetate (1 L) was added to the obtained reaction solution, and the mixture was washed successively with 1N hydrochloric acid, saturated aqueous sodium hydrogen carbonate, ion-exchanged water, and saturated brine, and the obtained organic phase was dried over magnesium sulfate. Magnesium sulfate was separated by filtration, the organic phase was concentrated, and then purified by a silica gel column (hexane/ethyl acetate=3/1) to obtain 148.8 g of the monomer mC-1c shown below.

mC-1c

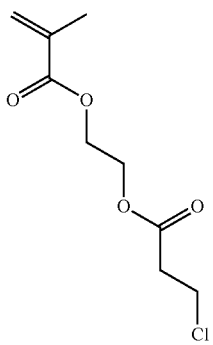

(Synthesis of Polymer P-1)

In a flask equipped with a cooling tube, a thermometer, and a stirrer, dimethylacetamide (35 g), monomer mA-1 (13.8 g), and methacroylcholine chloride (80% aqueous solution, manufactured by Tokyo Chemical Industry Co., Ltd.) (1.7 g) were added, and the obtained solution was heated to 80° C. and stirred while flowing 5 mL/min of nitrogen.

Next, a solution obtained by mixing V-601 (manufactured by FUJIFILM Wako Pure Chemical Corporation) (0.13 g) and dimethylacetamide (35 g) was added dropwise to the flask over 2 hours, and the reaction solution was stirred while maintaining the reaction solution in a heating state for another 5 hours. After completion of the reaction, the reaction solution was allowed to cool to room temperature, and dimethylacetamide (60 g) was added to the reaction solution and diluted to obtain a polymer solution having a polymer concentration of about 20% by mass.

The obtained polymer solution was poured into a large excess of methanol to precipitate the polymer, the precipitate was separated by filtration, and the obtained solid content was washed with a large amount of methanol, and then the resultant material was subjected to blast drying at room temperature for 24 hours to obtain a polymer P-1.

The numerical values described in each repeating unit in the following structural formula represent the content (% by mass) of each repeating unit with respect to all the repeating units, and in the following description, were 91% by mass and 9% by mass from the repeating unit on a left side.

In addition, a weight average molecular weight of the polymer P-1 measured by the above-mentioned method was 58,000.

P-1

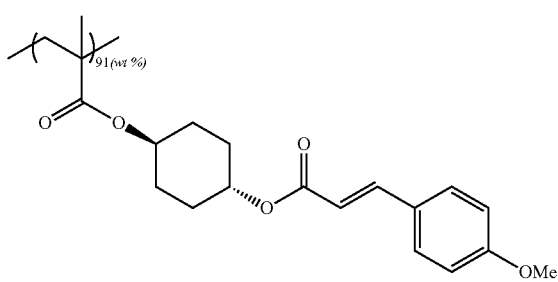

-continued

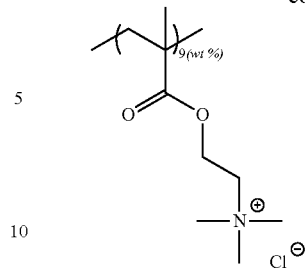

(Synthesis of Polymer P-2)

In a flask equipped with a cooling tube, a thermometer, and a stirrer, cyclohexanone (35 g), monomer mA-1 (12.0 g), and methacrylic acid (3.0 g) were added, and the obtained solution was heated to 80° C. and stirred while flowing 5 mL/min of nitrogen. Next, a solution obtained by mixing V-601 (manufactured by FUJIFILM Wako Pure Chemical Corporation) (0.21 g) and cyclohexanone (10 g) was added dropwise to the flask over 2 hours, and the reaction solution was stirred while maintaining the reaction solution in a heating state for another 7 hours. After completion of the reaction, the reaction solution was allowed to cool to room temperature, and cyclohexanone (30 g) was added to the reaction solution and diluted to obtain a polymer solution having a polymer concentration of about 20% by mass.

The obtained polymer solution was poured into a large excess of methanol to precipitate the polymer, the precipitate was separated by filtration, and the obtained solid content was washed with a large amount of methanol, and then the resultant material was subjected to blast drying at room temperature for 24 hours to obtain a polymer of the monomer mA-1 and methacrylic acid.

In addition, the obtained polymer of the monomer mA-1 and methacrylic acid (1.0 g) was added to a mixed solvent (4.0 g) of cyclohexanone/isopropyl alcohol (2/1) and dissolved at 50° C. Then, diisopropylethylamine (418 μL) was added to the obtained solution, and the mixture was stirred at 50° C. for 30 minutes to obtain a polymer P-2 (solid content concentration 20%).

The numerical values described in each repeating unit in the following structural formula represent the content (% by mass) of each repeating unit with respect to all the repeating units, and in the following description, were 79% by mass and 21% by mass from the repeating unit on a left side.

P-2

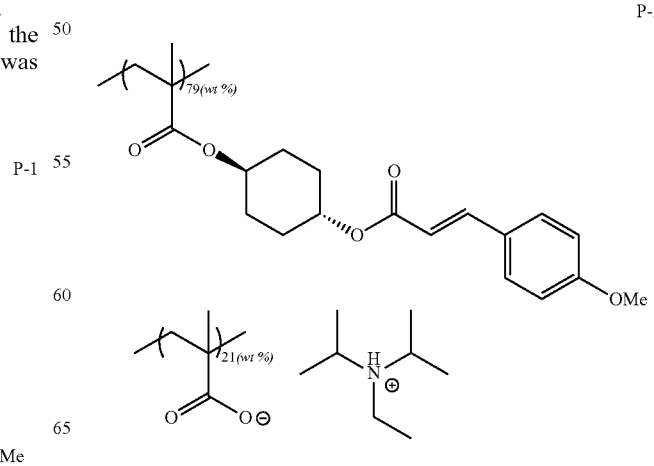

(Synthesis of Polymer P-3)

A polymer P-3 was synthesized by the same synthesis method as that of the polymer P-1, except that as a monomer, the monomer mA-1 (12.0 g) and 2,3-dihydroxypropyl methacrylate (manufactured by FUJIFILM Wako Pure Chemical Corporation) (3.0 g) were used.

The numerical values described in each repeating unit in the following structural formula represent the content (% by mass) of each repeating unit with respect to all the repeating units, and in the following description, were 80% by mass and 20% by mass from the repeating unit on a left side.

P-3

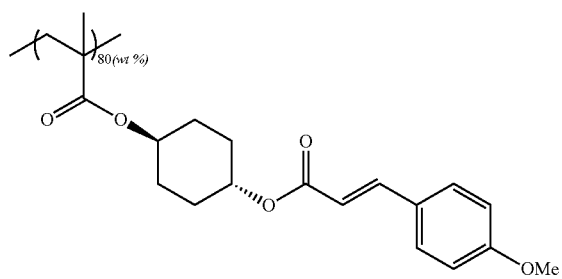

(Synthesis of Polymer P-4)

A monomer P-4 was synthesized by the same synthesis method as that of the polymer P-1, except that as a monomer, the monomer mA-1 (12.0 g) and 4-(4-acryloyloxybutoxy)benzoyloxyphenylboronic acid (3.0 g) were used.

The numerical values described in each repeating unit in the following structural formula represent the content (% by mass) of each repeating unit with respect to all the repeating units, and in the following description, were 81% by mass and 19% by mass from the repeating unit on a left side.

P-4

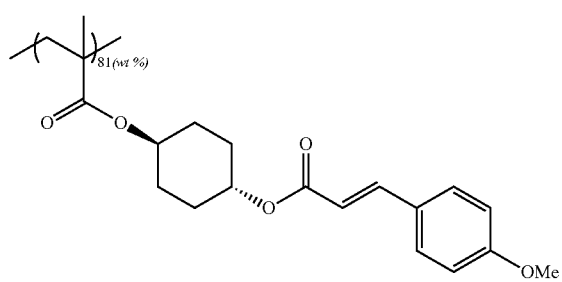

-continued

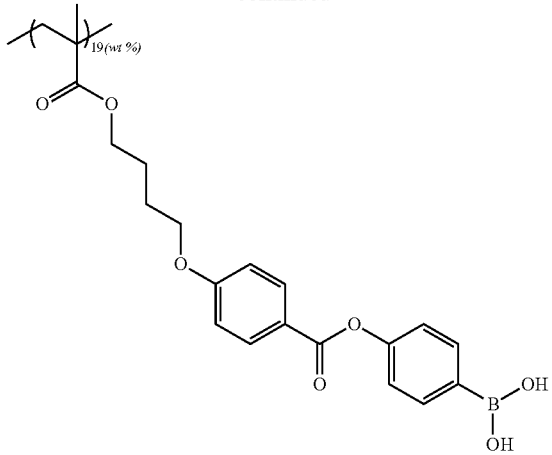

(Synthesis of Polymer P-5)

A polymer P-5 was synthesized by the same synthesis method as that of the polymer P-1, except that the monomer mA-1 was changed to the monomer mA-2.

The numerical values described in each repeating unit in the following structural formula represent the content (% by mass) of each repeating unit with respect to all the repeating units, and in the following description, were 91% by mass and 9% by mass from the repeating unit on a left side.

P-5

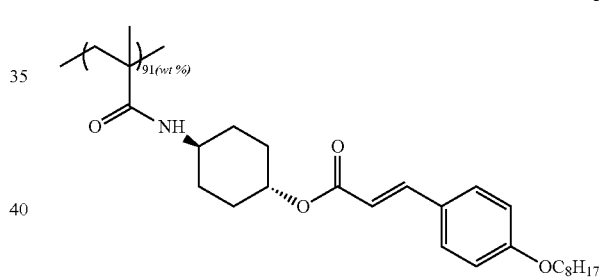

(Synthesis of Polymer P-6)

A polymer P-6 was synthesized by the same synthesis method as that of the polymer P-1, except that as the monomer, the monomer mA-1 (6.0 g), cyclomer M-100 (manufactured by Daicel) (7.7 g), and methacroylcholine chloride (80% aqueous solution, manufactured by Tokyo Chemical Industry Co., Ltd.) (1.7 g) were used.

The numerical values described in each repeating unit in the following structural formula represent the content (% by mass) of each repeating unit with respect to all the repeating units, and in the following description, were 40% by mass, 9% by mass, and 51% by mass from the repeating unit on a left side.

P-6

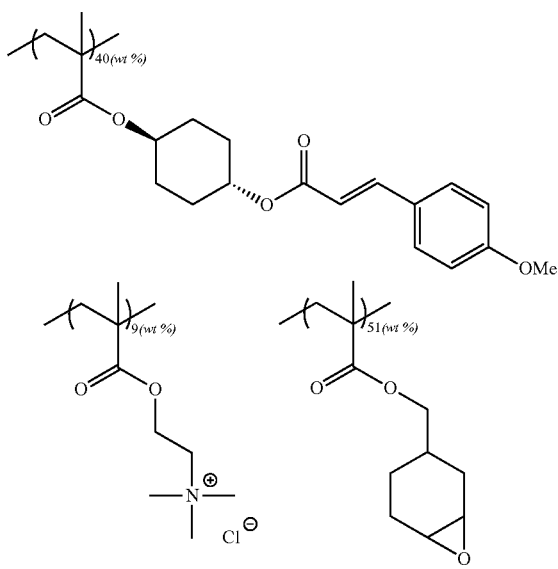

(Synthesis of Polymer P-7)

A polymer P-7 was synthesized by the same synthesis method as that of the polymer P-1, except that as the monomer, the monomer mA-1 (6.0 g), 1-adamantyl methacrylate (manufactured by Tokyo Chemical Industry Co., Ltd.) (7.7 g), and methacroylcholine chloride (80% aqueous solution, manufactured by Tokyo Chemical Industry Co., Ltd.) (1.7 g) were used.

The numerical values described in each repeating unit in the following structural formula represent the content (% by mass) of each repeating unit with respect to all the repeating units, and in the following description, were 40% by mass, 9% by mass, and 51% by mass from the repeating unit on a left side.

P-7

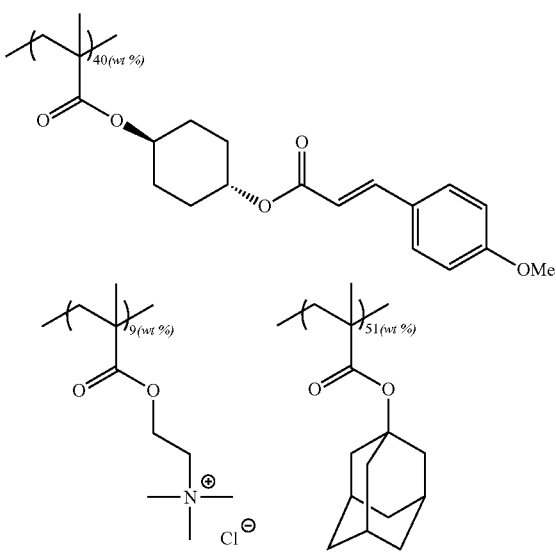

(Synthesis of Polymer P-8)

A polymer P-8 was synthesized by the same synthesis method as that of the polymer P-1, except that as the monomer, the monomer mA-1 (6.0 g), 2-(methacryloyloxy)ethylacetacetate (manufactured by FUJIFILM Wako Pure Chemical Corporation) (9.0 g) were used.

The numerical values described in each repeating unit in the following structural formula represent the content (% by mass) of each repeating unit with respect to all the repeating units, and in the following description, were 40% by mass and 60% by mass from the repeating unit on a left side.

P-8

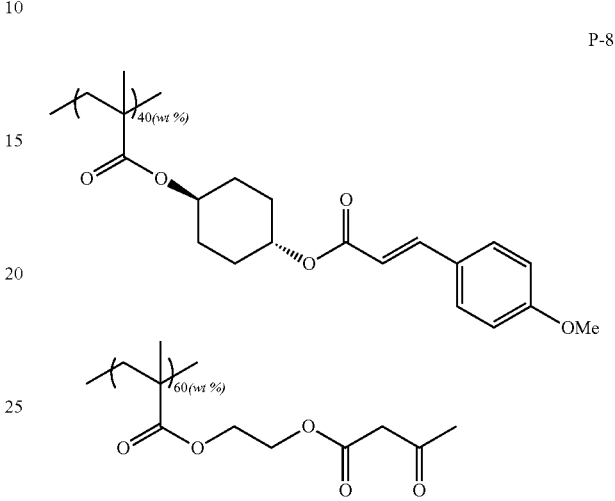

(Synthesis of Polymer P-9)

A polymer P-9 was synthesized by the same synthesis method as that of the polymer P-1, except that as the monomer, the monomer mA-1 (15.0 g) was used.

The numerical value described in each repeating unit in the following structural formula represents the content (% by mass) of each repeating unit with respect to all the repeating units, and in the following description, was 100% by mass from the repeating unit on a left side.

P-9

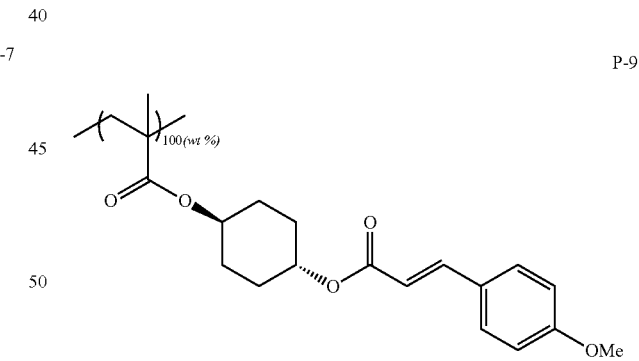

(Synthesis of Polymer P-10)

In a flask equipped with a cooling tube, a thermometer, and a stirrer, 2-butanone (23 g), monomer mA-1 (1.2 g), and methyl methacrylate(3-ethyloxetane-3-yl)methyl (manufactured by Tokyo Chemical Industry Co., Ltd.) (8.0 g), monomer mC-1c (1.2 g), and 2,2'-azobis(isobutyronitrile) (0.075 g) were charged, and the obtained solution was stirred as the reflux state was maintained for 7 hours by heating in a water bath while flowing 15 mL/min of nitrogen in the flask.

After completion of the reaction, the reaction solution was allowed to cool to room temperature, and the obtained polymer solution was poured into a large excess of methanol to precipitate the polymer. Then, the precipitate was separated by filtration to be recovered, and the recovered solid content was washed with a large amount of methanol and then vacuum dried at 40° C. for 6 hours to obtain a polymer P-10c.

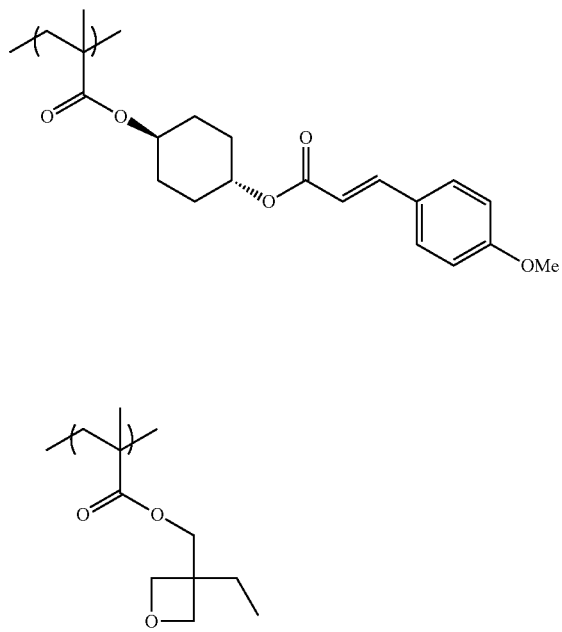

P-10c

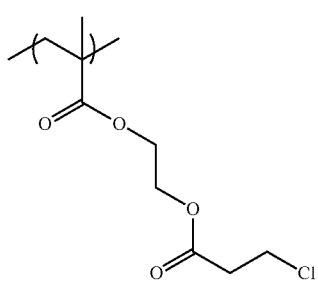

Subsequently, in a flask equipped with a cooling tube, a thermometer, and a stirrer, 3.3 g of the polymer P-10c, 4-methoxyphenol (0.016 g), triethylamine (3.75 g), and dimethylacetamide (4.95 g) were charged, and the obtained solution was stirred at 60° C. for 4 hours by heating in a water bath.

After completion of the reaction, the reaction solution was allowed to cool to room temperature, and the obtained reaction solution was poured into a large excess of methanol/water (1/3) to precipitate the polymer. The precipitate was separated by filtration to be recovered, washed with a large amount of methanol/water (1/3), and then subjected to blast drying at 40° C. for 12 hours to obtain a polymer P-10.

The numerical values described in each repeating unit in the following structural formula represent the content (% by mass) of each repeating unit with respect to all the repeating units, and in the following description, were 12% by mass, 78% by mass, and 10% by mass from the repeating unit on a left side.

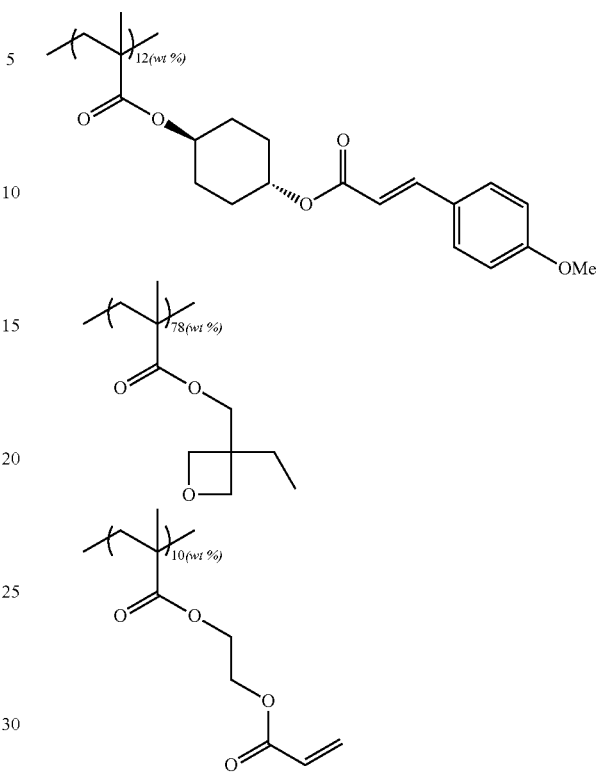

(Preparation of Base Material B-1)

A base material B-1 was obtained by performing corona treatment on one surface of a cycloolefin polymer film (ZF-14, manufactured by Zeon Corporation) once using a corona treatment device under conditions of an output of 0.3 kW and a treatment speed of 7.6 m/min.

The base material B-1 had a hydrogen-bonding group such as a hydroxy group on the corona-treated surface.

(Preparation of Base Material B-2)

A cellulose acylate film (FUJITAC ZRD40, manufactured by FUJIFILM Corporation) passed through dielectric heating rolls at a temperature of 60° C., a film surface temperature was raised to 40° C., and then an alkali solution having the following composition was applied onto one surface of the film using a bar coater at a coating rate of 14 ml/m², and heated to 110° C.

Next, the obtained film was transported for 10 seconds under a steam type far-infrared heater manufactured by NORITAKE Co., Ltd.

Next, pure water was applied onto the obtained film at 3 ml/m² using the same bar coater.

Next, washing using a fountain coater and draining using an air knife was repeated three times on the obtained film, and then transported to a drying zone at 70° C. for 10 seconds, and dried to prepare an alkali saponification-treated cellulose acylate film.

TABLE 1

| Alkali solution composition | |
|---|---|
| Potassium hydroxide | 4.7 parts by mass |
| Water | 15.8 parts by mass |
| Isopropanol | 63.7 parts by mass |

TABLE 1-continued

| Alkali solution composition | |
|---|---|
| Surfactant (C$_{14}$H$_{29}$O(CH$_2$CH$_2$O)$_{20}$H) | 1.0 parts by mass |
| Propylene glycol | 14.8 parts by mass |

An alignment layer coating liquid having the following composition was applied onto the saponification-treated cellulose acylate film as described above using a bar coater. After application, the obtained film was dried by hot air at 60° C. for 60 seconds, and further dried by hot air at 100° C. for 120 seconds to obtain an alignment layer Y1.

Further, in the composition below, "Polymerization initiator (IN1)" represents a photopolymerization initiator (IRGACURE 2959, manufactured by BASF).

TABLE 2

| Alignment layer coating liquid composition | |
|---|---|
| The following modified-polyvinyl alcohol | 10.0 parts by mass |
| Water | 371.0 parts by mass |
| Methanol | 119.0 parts by mass |
| Glutaraldehyde | 0.5 parts by mass |
| Polymerization initiator (IN1) | 0.3 parts by mass |

(In the following structural formula, the proportion is a molar ratio.)

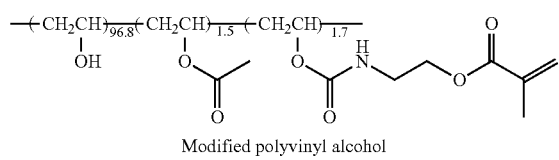

Modified polyvinyl alcohol

The following composition 1 for forming a vertically aligned liquid crystal layer was applied onto the alignment layer Y1 using a bar coater. The coating film formed on the alignment layer was heated at 60° C. for 1 minute with hot air, and then 300 mJ/cm$^2$ of ultraviolet rays at a wavelength of 365 nm were emitted from a side of the coating film using a high-pressure mercury lamp under a nitrogen atmosphere while maintaining 60° C. By the above procedure, a laminate of a cellulose acylate film, an alignment layer Y1, and a liquid crystal layer (film thickness 0.4 μm) to which a vertically aligned liquid crystal compound was fixed was prepared.

| Preparation of composition 1 for forming vertically aligned liquid crystal layer | |
|---|---|
| The following polymerizable liquid crystal compound L-1 | 83.0 parts by mass |
| The following polymerizable liquid crystal compound L-2 | 15.0 parts by mass |
| The following polymerizable liquid crystal compound L-3 | 2.0 parts by mass |
| Polymerizable monomer (EBECRYL1290, manufactured by Daisel Ornex) | 3.3 parts by mass |
| Polymerization initiator (Irgacure OXE01, manufactured by BASF) | 4.0 parts by mass |
| The following fluorine-based polymer M-1 | 0.5 parts by mass |
| The following onium salt compound S01 | 1.0 parts by mass |
| The following boronic acid compound S02 | 0.5 parts by mass |
| Methyl ethyl ketone | 636.3 parts by mass |

Polymerizable Liquid Crystal Compound L-1

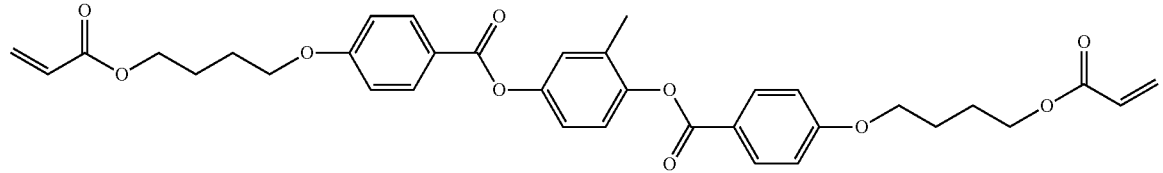 [SMILES: C=CC(=O)OCCCCOc1ccc(C(=O)Oc2ccc(OC(=O)c3ccc(OCCCCOC(=O)C=C)cc3)c(C)c2)cc1]

Polymerizable Liquid Crystal Compound L-2

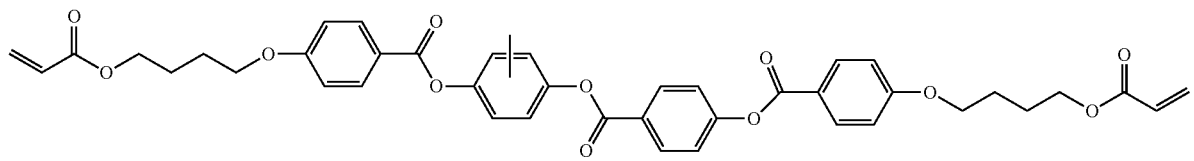

Polymerizable Liquid Crystal Compound L-3

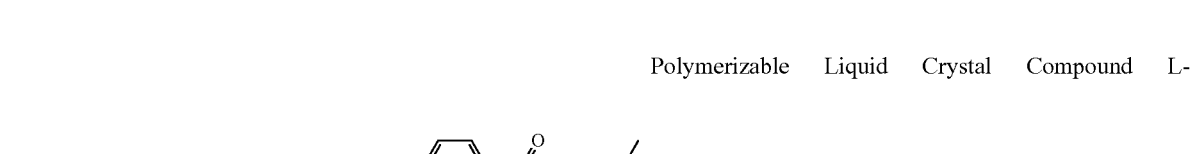

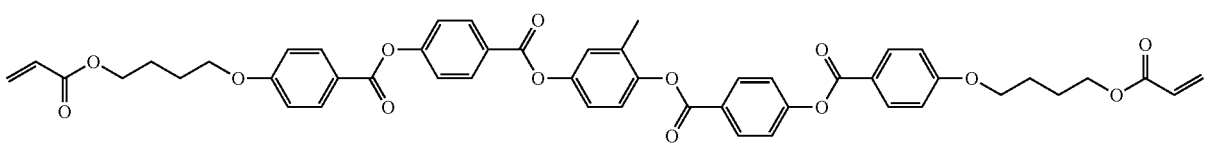 [SMILES: C=CC(=O)OCCCCOc1ccc(C(=O)Oc2ccc(C(=O)Oc3ccc(OC(=O)c4ccc(OC(=O)c5ccc(OCCCCOC(=O)C=C)cc5)cc4)c(C)c3)cc2)cc1]

Fluorine-Based Polymer M-1

Boronic Acid Compound S02

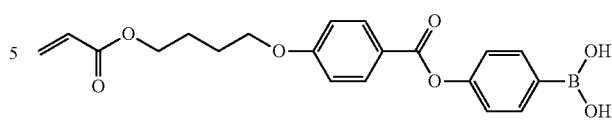

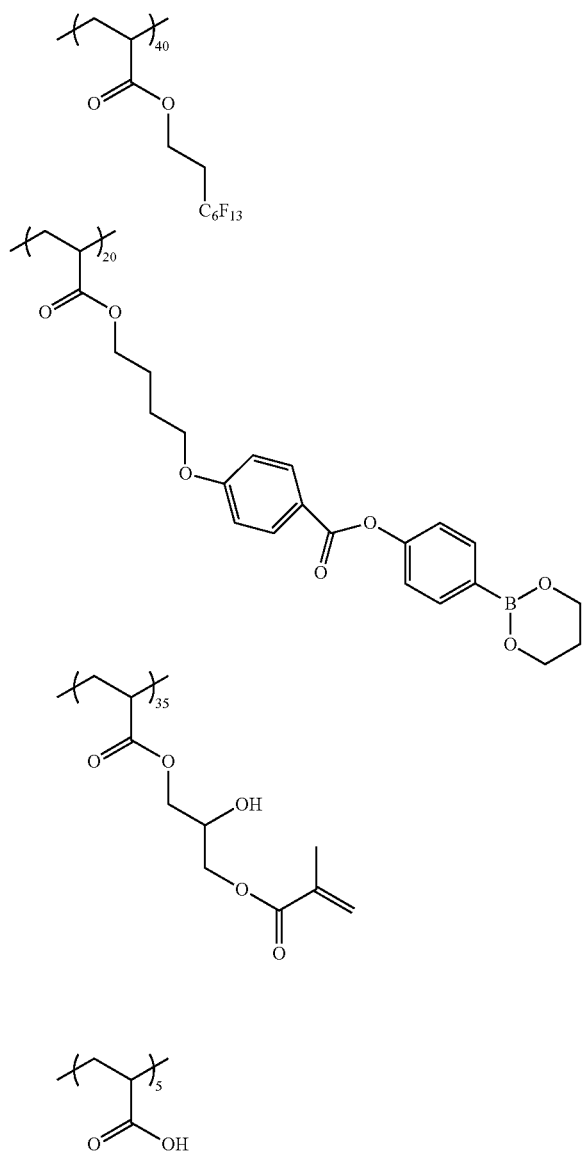

A side of the liquid crystal layer on which the vertically aligned liquid crystal compound of the above-mentioned obtained laminate was fixed was treated once using a corona treatment device under the conditions of an output of 0.3 kW and a treatment speed of 7.6 m/min to obtain a base material B-2.

The base material B-2 had a hydrogen-bonding group such as a hydroxy group on the corona-treated surface.

Example 1

The following composition 1 for forming a liquid crystal layer was applied to the surface of the base material B-1 on the corona-treated side using a bar coater. The coating film formed on the base material was dried at room temperature for 30 seconds, and then irradiated with polarized ultraviolet rays (50 mJ/cm² at a wavelength of 313 nm) from a side of the surface opposite to the surface on which a coating film of the base material was formed (opposite side to the surface on the coating film was formed) through a band pass filter (BPF313, manufactured by Asahi Spectrometer Co., Ltd.) having a wavelength of 313 nm and a wire grid-type polarizer using a high-pressure mercury lamp. Then, the obtained laminate was heated with hot air at 120° C. for 1 minute, then cooled to 60° C., then irradiated with ultraviolet rays of 80 mJ/cm² at a wavelength of 365 nm from the side of the coating film using a high-pressure mercury lamp under a nitrogen atmosphere, and subsequently irradiated with ultraviolet rays of 300 mJ/cm² from the side of the coating film while heating at 120° C. By the above procedure, an optical film of Example 1, which is a laminate of the base material B-1 and the liquid crystal layer (film thickness 2.7 µm), was prepared. Re (550) of the obtained optical film was 140 nm.

| Composition 1 for forming liquid crystal layer | |
| --- | --- |
| The above polymerizable liquid crystal compound L-1 | 7.1 parts by mass |
| The above polymerizable liquid crystal compound L-2 | 1.3 parts by mass |
| The above polymerizable liquid crystal compound L-3 | 0.2 parts by mass |

Onium Salt Compound S01

| Composition 1 for forming liquid crystal layer | |
|---|---|
| The following polymerizable liquid crystal compound L-4 | 46.5 parts by mass |
| The following polymerizable liquid crystal compound L-5 | 25.0 parts by mass |
| The following polymerizable liquid crystal compound L-6 | 15.0 parts by mass |
| The following polymerizable compound A-1 | 5.0 parts by mass |
| The following polymerizable compound A-2 | 5.0 parts by mass |
| Polymerization initiator (Irgacure2959, manufactured by Ciba Specialty Chemicals) | 4.0 parts by mass |
| The following leveling agent T-1 | 0.2 parts by mass |
| Polymer P-1 | 3.0 parts by mass |
| Cyclopentanone | 201.6 parts by mass |
| Methyl ethyl ketone | 60.2 parts by mass |

Polymerizable Liquid Crystal Compound L-4

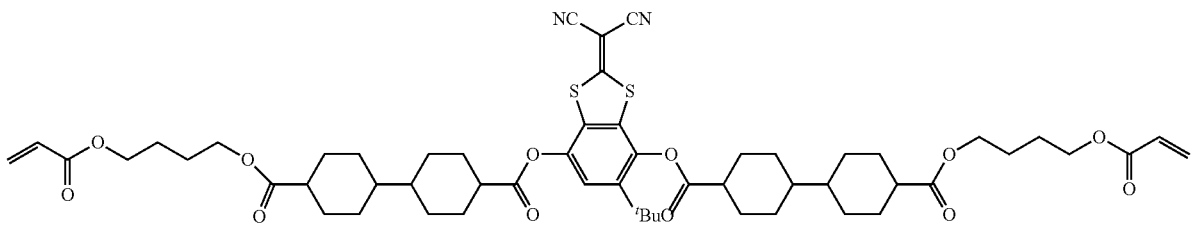

Polymerizable Liquid Crystal Compound L-5

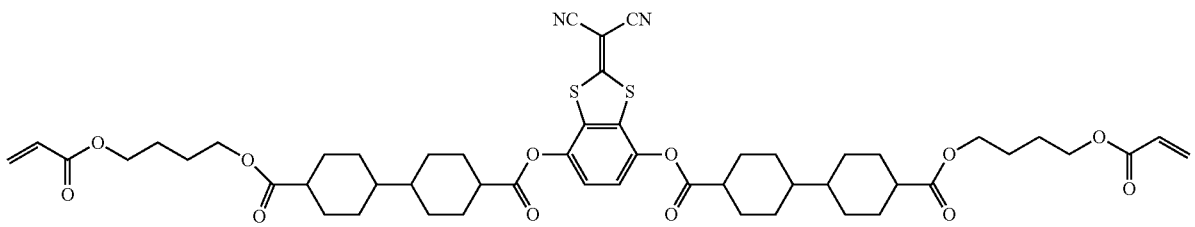 [SMILES: C=CC(=O)OCCCCOC(=O)C1CCC(C2CCC(C(=O)Oc3ccc(OC(=O)C4CCC(C5CCC(C(=O)OCCCCOC(=O)C=C)CC5)CC4)c4c3SC(=C(C#N)C#N)S4)CC2)CC1]

Polymerizable Liquid Crystal Compound L-6

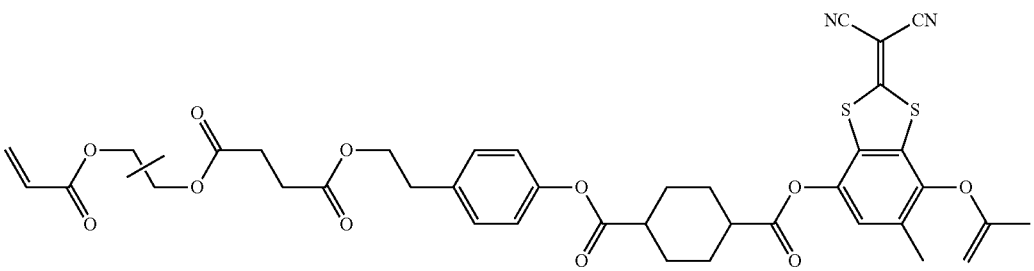

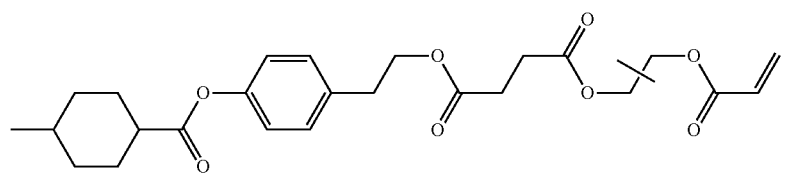

Polymerizable Compound A-1

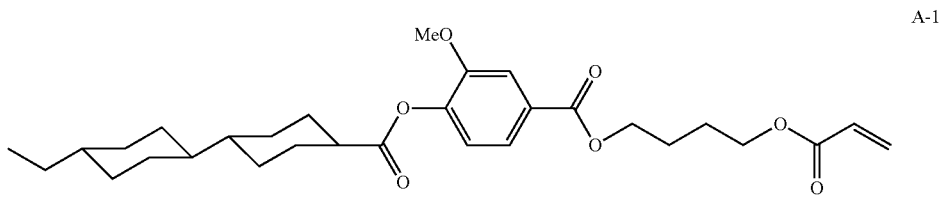 [SMILES: C=CC(=O)OCCCCOC(=O)c1ccc(OC(=O)C2CCC(C3CCC(CC)CC3)CC2)c(OC)c1]

Polymerizable Compound A-2

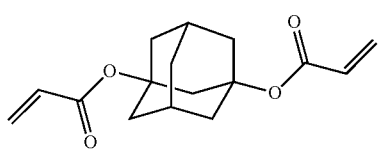 [SMILES: C=CC(=O)OC12CC3CC(C1)CC(OC(=O)C=C)(C3)C2]

Leveling Agent T-1

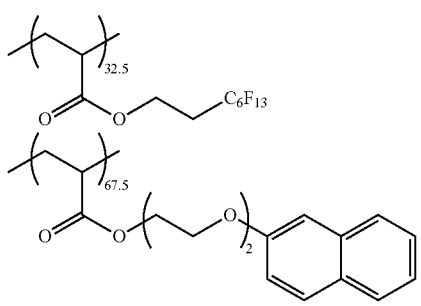

Example 2

An optical film was prepared according to the same procedure as in Example 1, except that the composition 1 for forming a liquid crystal layer was changed to the following composition 2 for forming a liquid crystal layer.

| Composition 2 for forming liquid crystal layer | |
|---|---|
| The above polymerizable liquid crystal compound L-1 | 7.1 parts by mass |
| The above polymerizable liquid crystal compound L-2 | 1.3 parts by mass |
| The above polymerizable liquid crystal compound L-3 | 0.2 parts by mass |
| The above polymerizable liquid crystal compound L-4 | 46.5 parts by mass |
| The above polymerizable liquid crystal compound L-5 | 25.0 parts by mass |
| The above polymerizable liquid crystal compound L-6 | 15.0 parts by mass |
| The above polymerizable compound A-1 | 5.0 parts by mass |
| The above polymerizable compound A-2 | 5.0 parts by mass |
| Polymerization initiator (Irgacure2959, manufactured by Ciba Specialty Chemicals) | 4.0 parts by mass |
| The above leveling agent T-1 | 0.2 parts by mass |
| Polymer P-2 (solid content concentration 20%) | 15.0 parts by mass |
| Cyclopentanone | 192.4 parts by mass |
| Methyl ethyl ketone | 57.4 parts by mass |

Example 3

The following composition 3 for forming a liquid crystal layer was applied onto a surface of the base material B-1 on the corona-treated side using a bar coater. The coating film formed on the base material was dried at room temperature for 30 seconds, and then heated with hot air at 120° C. for 1 minute. Subsequently, the coating film was irradiated with polarized ultraviolet rays (50 mJ/cm² at a wavelength of 313 nm) from a side of the surface opposite to the surface where the coating film of the base material was formed) (opposite side to the surface on the coating film was formed) through a bandpass filter having a wavelength of 313 nm (BPF313, manufactured by Asahi Spectrometer Co., Ltd.) and a wire grid polarizer using a high-pressure mercury lamp. Then, the obtained laminate was heated with hot air at 120° C. for 1 minute, then cooled to 60° C., then irradiated with ultraviolet rays of 80 mJ/cm² at a wavelength of 365 nm from the side of the coating film using a high-pressure mercury lamp under a nitrogen atmosphere, and subsequently irradiated with ultraviolet rays of 300 mJ/cm² from the side of the coating film while heating at 120° C. By the above procedure, an optical film of Example 3 which is a laminate of the base material B-1 and the liquid crystal layer (film thickness 2.7 μm) was prepared.

| Composition 3 for forming liquid crystal layer | |
|---|---|
| The above polymerizable liquid crystal compound L-1 | 7.1 parts by mass |
| The above polymerizable liquid crystal compound L-2 | 1.3 parts by mass |
| The above polymerizable liquid crystal compound L-3 | 0.2 parts by mass |
| The above polymerizable liquid crystal compound L-4 | 46.5 parts by mass |
| The above polymerizable liquid crystal compound L-5 | 25.0 parts by mass |
| The above polymerizable liquid crystal compound L-6 | 15.0 parts by mass |
| The above polymerizable compound A-1 | 5.0 parts by mass |
| The above polymerizable compound A-2 | 5.0 parts by mass |
| Polymerization initiator (Irgacure2959, manufactured by Ciba Specialty Chemicals) | 4.0 parts by mass |
| The above leveling agent T-1 | 0.2 parts by mass |
| Polymer P-3 | 3.0 parts by mass |
| Cyclopentanone | 201.6 parts by mass |
| Methyl ethyl ketone | 60.2 parts by mass |

Example 4

An optical film was prepared according to the same procedure as in Example 3, except that the polymer P-3 was changed to the polymer P-4.

Example 5

An optical film was prepared according to the same procedure as in Example 1, except that the polymer P-1 was changed to the polymer P-5.

Example 6

An optical film was prepared according to the same procedure as in Example 3, except that the composition 3 for forming a liquid crystal layer was changed to the following composition 4 for forming a liquid crystal layer.

| Composition 4 for forming liquid crystal layer | |
|---|---|
| The above polymerizable liquid crystal compound L-1 | 7.1 parts by mass |
| The above polymerizable liquid crystal compound L-2 | 1.3 parts by mass |
| The above polymerizable liquid crystal compound L-3 | 0.2 parts by mass |
| The above polymerizable liquid crystal compound L-4 | 46.5 parts by mass |
| The above polymerizable liquid crystal compound L-5 | 25.0 parts by mass |
| The above polymerizable liquid crystal compound L-6 | 15.0 parts by mass |
| The above polymerizable compound A-1 | 5.0 parts by mass |
| The above polymerizable compound A-2 | 5.0 parts by mass |
| Polymerization initiator (Irgacure2959, manufactured by Ciba Specialty Chemicals) | 4.0 parts by mass |
| The above leveling agent T-1 | 0.2 parts by mass |
| Polymer P-6 | 3.0 parts by mass |
| The following thermal acid generator D-2 | 3.0 parts by mass |
| Cyclopentanone | 201.6 parts by mass |
| Methyl ethyl ketone | 60.2 parts by mass |

Thermal Acid Generator D-2

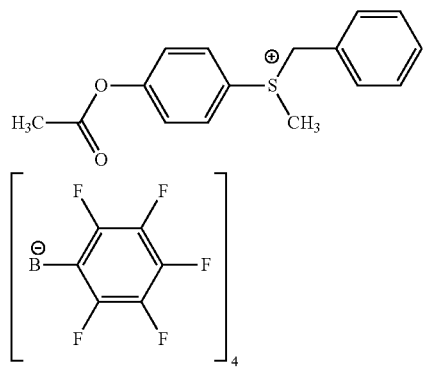

Example 7

An optical film was prepared according to the same procedure as in Example 1, except that the polymer P-1 was changed to the polymer P-7.

Example 8

The following composition 5 for forming a liquid crystal layer was applied onto one surface of a cellulose acylate film (FUJITAC ZRD40, manufactured by FUJIFILM Corporation) (film thickness 40 μm) using a bar coater. A surface on which the composition 5 for forming a liquid crystal layer of the cellulose acylate film was applied had a hydroxy group.

Next, the coating film formed on the base material (cellulose acylate film) was dried at room temperature for 30 seconds, and then irradiated with polarized ultraviolet rays (50 mJ/cm2 at a wavelength of 313 nm) from a side of the surface opposite to the surface on which the coating film of the base material was formed (side opposite to the surface on which the coating film was formed) through a bandpass filter having a wavelength of 313 nm (BPF313, manufactured by Asahi Spectral Co., Ltd.) and a wire grid polarizer using a high-pressure mercury lamp. Then, the obtained laminate was heated with hot air at 120° C. for 1 minute, then cooled to 60° C., then irradiated with ultraviolet rays of 80 mJ/cm² at a wavelength of 365 nm from the side of the coating film using a high-pressure mercury lamp under a nitrogen atmosphere, and subsequently irradiated with ultraviolet rays of 300 mJ/cm² from the side of the coating film while heating at 120° C. By the above procedure, an optical film of Example 8 which is a laminate of a cellulose acylate film and a liquid crystal layer (film thickness 2.7 μm) was prepared.

| Composition 5 for forming liquid crystal layer | |
|---|---|
| The above polymerizable liquid crystal compound L-1 | 7.1 parts by mass |
| The above polymerizable liquid crystal compound L-2 | 1.3 parts by mass |
| The above polymerizable liquid crystal compound L-3 | 0.2 parts by mass |
| The above polymerizable liquid crystal compound L-4 | 46.5 parts by mass |
| The above polymerizable liquid crystal compound L-5 | 25.0 parts by mass |
| The above polymerizable liquid crystal compound L-6 | 15.0 parts by mass |
| The above polymerizable compound A-1 | 5.0 parts by mass |
| The above polymerizable compound A-2 | 5.0 parts by mass |
| Polymerization initiator (Irgacure2959, manufactured by Ciba Specialty Chemicals) | 4.0 parts by mass |
| The above leveling agent T-1 | 0.2 parts by mass |
| Polymer P-8 | 3.0 parts by mass |
| Cyclopentanone | 201.6 parts by mass |
| Methyl ethyl ketone | 60.2 parts by mass |

Example 9

An optical film was prepared according to the same procedure as in Example 1, except that the base material B-1 was changed to the base material B-2.

Example 10

The following composition 6 for forming a liquid crystal layer was applied onto a surface of the base material B-1 on the corona-treated side using a bar coater. The coating film formed on the base material was dried at room temperature for 30 seconds, and then irradiated with polarized ultraviolet rays (50 mJ/cm² at a wavelength of 313 nm) from a side of the surface opposite to the surface on which a coating film of the base material was formed (opposite side to the surface on the coating film was formed) through a band pass filter (BPF313, manufactured by Asahi Spectrometer Co., Ltd.) having a wavelength of 313 nm and a wire grid-type polarizer using a high-pressure mercury lamp. Then, the obtained laminate was heated with hot air at 110° C. for 4 minutes, and then irradiated with ultraviolet rays of 500 mJ/cm2 at a wavelength of 365 nm from the side of the coating film using a high-pressure mercury lamp under a nitrogen atmosphere. By the above procedure, an optical film of Example 9, which is a laminate of the base material B-1 and the liquid crystal layer (film thickness 2.0 m), was prepared.

| Composition 6 for forming liquid crystal layer | |
|---|---|
| The following polymerizable liquid crystal compound L-7 | 10.0 parts by mass |
| The following polymerizable liquid crystal compound L-8 | 90.0 parts by mass |
| Polymerization initiator (Irgacure2959, manufactured by Ciba Specialty Chemicals) | 4.0 parts by mass |
| Fluorine-based leveling agent (S420, manufactured by AGC Seimi Chemical Co., Ltd.) | 0.2 parts by mass |

| Composition 6 for forming liquid crystal layer | |
|---|---|
| Polymer P-1 | 3.0 parts by mass |
| Cyclopentanone | 162.3 parts by mass |
| 1,3-dioxolane | 243.5 parts by mass |

| Composition 1 for forming photo-alignment layer | |
|---|---|
| Diisopropylethylamine | 0.60 parts by mass |
| Butyl acetate | 953.12 parts by mass |
| Methyl ethyl ketone | 238.28 parts by mass |

Polymerizable Liquid Crystal Compound L-7

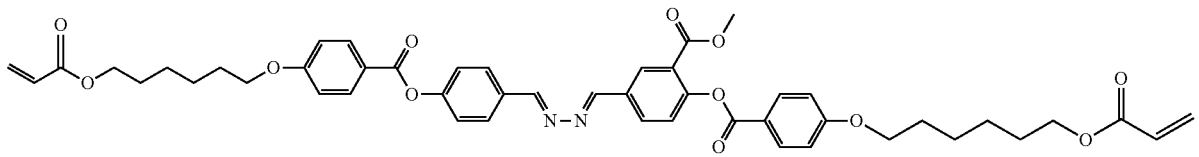 [SMILES: C=CC(=O)OCCCCCCOc1ccc(C(=O)Oc2ccc(/C=N/N=C/c3ccc(OC(=O)c4ccc(OCCCCCCOC(=O)C=C)cc4)c(C(=O)OC)c3)cc2)cc1]

Polymerizable Liquid Crystal Compound L-8

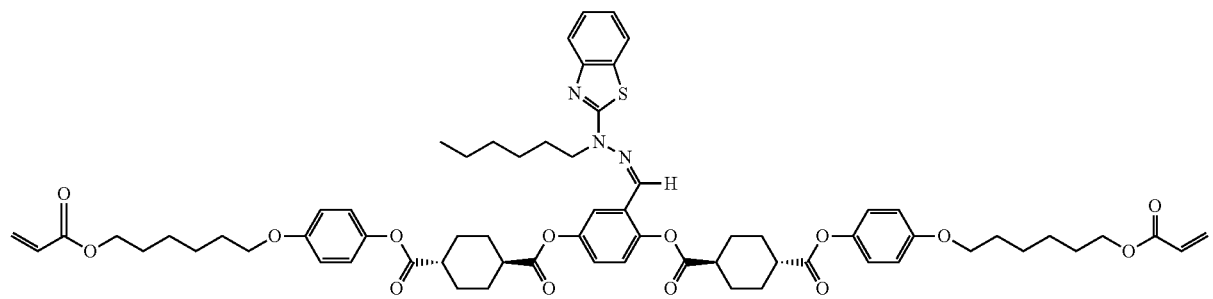 [SMILES: C=CC(=O)OCCCCCCOc1ccc(OC(=O)[C@H]2CC[C@H](C(=O)Oc3ccc(OC(=O)[C@H]4CC[C@H](C(=O)Oc5ccc(OCCCCCCOC(=O)C=C)cc5)CC4)c(/C=N\N(CCCCCC)c4nc5ccccc5s4)c3)CC2)cc1]

Example 11

An optical film was prepared according to the same procedure as in Example 1 except that the addition amount of the polymer P-1 was changed to 40.0 parts by mass.

Comparative Example 1

An optical film was prepared according to the same procedure as in Example 1, except that the polymer P-1 was changed to the polymer P-9.

Comparative Example 2

The following composition 1 for forming a photo-alignment layer was applied onto a surface of the base material B-1 on the corona-treated side using a bar coater. Then, the coating film formed on the base material was dried with hot air at 125° C. for 2 minutes to remove the solvent, and a precursor layer having a thickness of 0.3 μm was formed. Next, the resultant material was irradiated with polarized ultraviolet rays (50 mJ/cm² at a wavelength of 313 nm) from a side of the precursor layer through a bandpass filter (BPF313, manufactured by Asahi Spectroscopy Co., Ltd.) having a wavelength of 313 nm and a wire grid polarizer using a high-pressure mercury lamp to form a photo-alignment layer (film thickness of 0.3 μm).

| Composition 1 for forming photo-alignment layer | |
|---|---|
| Polymer P-10 | 100.00 parts by mass |
| Thermal acid generator D-1 | 6.00 parts by mass |

Next, the following composition 7 for forming a liquid crystal layer was applied onto a photo-alignment layer using a bar coater. The obtained laminate was heated with hot air at 120° C. for 1 minute, then cooled to 60° C., then irradiated with ultraviolet rays of 80 mJ/cm² at a wavelength of 365 nm from a side of the coating film using a high-pressure mercury lamp under a nitrogen atmosphere, and subsequently irradiated with ultraviolet rays of 300 mJ/cm² from the side of the coating film while heating to 120° C. By the above procedure, an optical film of Comparative Example 2 which is a laminate of the base material B-1, the photo-alignment layer, and the liquid crystal layer (film thickness 2.7 μm) was prepared.

| Composition 7 for forming liquid crystal layer | |
|---|---|
| The above polymerizable liquid crystal compound L-1 | 7.1 parts by mass |
| The above polymerizable liquid crystal compound L-2 | 1.3 parts by mass |
| The above polymerizable liquid crystal compound L-3 | 0.2 parts by mass |
| The above polymerizable liquid crystal compound L-4 | 46.5 parts by mass |
| The above polymerizable liquid crystal compound L-5 | 25.0 parts by mass |
| The above polymerizable liquid crystal compound L-6 | 15.0 parts by mass |
| The above polymerizable compound A-1 | 5.0 parts by mass |
| The above polymerizable compound A-2 | 5.0 parts by mass |
| Polymerization initiator (Irgacure2959, manufactured by Ciba Specialty Chemicals) | 4.0 parts by mass |
| The above leveling agent T-1 | 0.2 parts by mass |
| Cyclopentanone | 201.6 parts by mass |
| Methyl ethyl ketone | 60.2 parts by mass |

Comparative Example 3

An optical film was prepared according to the same procedure as in Comparative Example 2, except that the base material B-1 was changed to the base material B-2.

<Evaluation>

(Evaluation of Liquid Crystal Aligning Properties)

A square film having a side length of 40 mm was cut out from the optical film obtained in each of Examples and Comparative Examples. The obtained sample was observed with a polarizing microscope under a cross Nicol (using a tenfold objective lens), and the liquid crystal aligning properties were evaluated according to the following criteria.

A: There was no light leakage in the observation field.

B: There was slight light leakage in the observation field.

C: There was light leakage in the observation field.

(Evaluation of Tilt Angle of Liquid Crystal Compound)

The optical films obtained in each of Examples and Comparative Examples were embedded in an epoxy resin to prepare a sample piece. This sample piece was sliced in parallel with a thickness direction of the liquid crystal layer using a microtome to obtain an observation sample. The slicing was performed so that an in-plane slow phase axial direction of the liquid crystal layer and the cross section were parallel to each other. Then, the observation sample was placed on a stage of a polarizing microscope, and the cross section revealed by the slice was observed while rotating the stage. A tilt angle of the liquid crystal compound contained in the liquid crystal layer was measured from a rotation angle of the stage when the liquid crystal layer revealed in the cross section was a quenching position. At this time, in the liquid crystal layer, an average tilt angle of the liquid crystal compound at positions of 0% to 20% (the region from the interface with air to the thickness position of 20% of the total film thickness), 20% to 80% (the region from the thickness position of 20% of the total film thickness to the thickness position of 80% of the total film thickness), and 80% to 100% (the region from the thickness position of 80% of the total film thickness to the interface with the organic base material) was evaluated in a film thickness direction from the surface (air interface).

(Evaluation of Wind Irregularity)

Two polarizing plates were placed on the cross Nicol, and the optical film obtained in each of Examples and Comparative Examples was placed therebetween to observe the presence or absence of streak-like irregularity, and wind irregularity was evaluated according to the following criteria.

A: Irregularity was almost invisible.

B: Irregularity could be visible.

(Evaluation of Durability of Liquid Crystal Layer)

A square film having a side length of 40 mm was cut out from the optical film obtained in each of Examples 1 to 8 10, and 11 and Comparative Example 2. A pressure sensitive adhesive was attached to a surface of the obtained film on a side of the liquid crystal layer, a pressure sensitive surface thereof was attached to glass of the same size as the film, and then a base material of the film was peeled off (the liquid crystal layer was transferred). At this time, in Comparative Example 2, the photo-alignment layer was transferred together with the liquid crystal layer.

Figure 4:
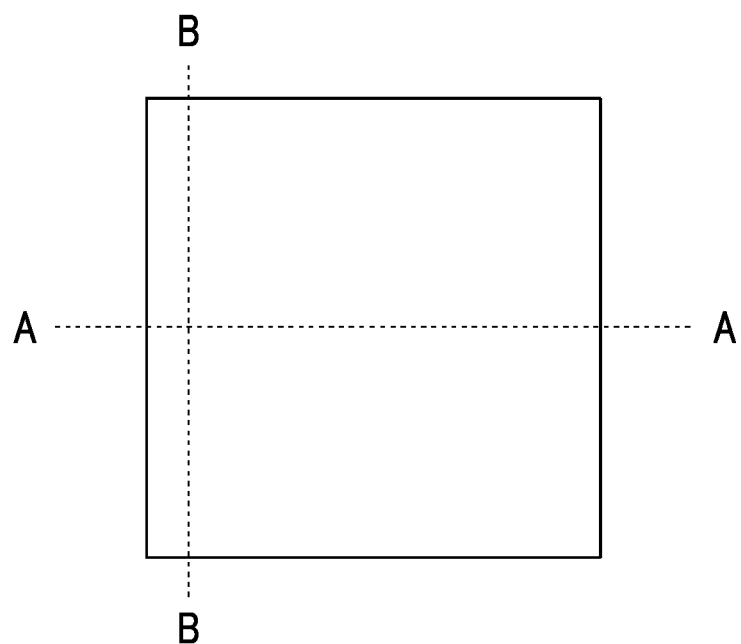
FIG. 4 is a diagram for showing a measurement position in a sample on which durability evaluation is performed.

The obtained square-shaped attached product having a side length of 40 mm was held in an environment of a temperature of 100° C. and a humidity of 95% for 144 hours, and then, as shown in FIG. 4, Re (550) (in-plane retardation at a wavelength of 550 nm) at an intersection of the A-A line passing through a midpoint of each of two opposing sides of the bonded product and the B-B line orthogonal to the A-A line and 2 mm away from a side of the bonded product was measured, and evaluated according to the following criteria.

A: A case where the proportion of Re (550) after holding to Re (550) before holding in an environment of a temperature of 100° C. and a humidity of 95% is 98% or more B: A case where the proportion of Re (550) after holding to Re (550) before holding in an environment of a temperature of 100° C. and a humidity of 95% is 96% or more and less than 98%

C: A case where the proportion of Re (550) after holding to Re (550) before holding in an environment of a temperature of 100° C. and a humidity of 95% is less than 96%

(Evaluation of Durability of Optical Film)

A square film having a side length of 40 mm was cut out from the optical films obtained in Example 9 and Comparative Example 3. A pressure sensitive adhesive was attached to a surface of the obtained film on a side of the liquid crystal layer, and a pressure sensitive surface thereof was attached to glass of the same size as the film.

The obtained square-shaped bonded product having a side length of 40 mm was held in an environment of a temperature of 100° C. and a humidity of 95% for 144 hours, and then, as shown in FIG. 4, Re (550) at an intersection of the A-A line passing through a midpoint of each of two opposing sides of the bonded product and the B-B line orthogonal to the A-A line and 2 mm away from a side of the bonded product was measured, and evaluated according to the following criteria.

A: A case where the proportion of Re (550) after holding to Re (550) before holding in an environment of a temperature of 100° C. and a humidity of 95% is 98% or more B: A case where the proportion of Re (550) after holding to Re (550) before holding in an environment of a temperature of 100° C. and a humidity of 95% is 96% or more and less than 98%

C: A case where the proportion of Re (550) after holding to Re (550) before holding in an environment of a temperature of 100° C. and a humidity of 95% is less than 96%

As shown in Table 3 described later, in Examples 1 to 11, the liquid crystal compound having a homogeneous alignment was fixed on the surface of the liquid crystal layer on the side of the organic base material.

TABLE 3

| | Composition for forming photo-alignment layer | | Composition for forming liquid crystal layer | | | Evaluation result | | | | | | | |
|---|---|---|---|---|---|---|---|---|---|---|---|---|---|
| | | | Photo-alignment compound | | Uneven distribution degree in liquid crystal layer | | Liquid crystal aligning prop-erties | Average tilt angle of liquid crystal compound | | | Wind irreg-ularity | Durability | |
| | Organic base material Kind | Photo-alignment compound Kind | Level-ing agent Kind | Kind | Addition amount (parts by mass) | Level-ing agent ($I_{B1}/I_{B2}$) | Photo-alignment compound ($I_{A1}/I_{A2}$) | | 0% to 20% from surface | 20% to 80% from surface | 80% to 100% from surface | | Liquid crystal layer | Op-tical film |
| Example 1 | B-1 | — | T-1 | P-1 | 3 | 89.1 | 11.5 | A | 0 | 0 | 0 | A | A | — |
| Example 2 | B-1 | — | T-1 | P-2 | 3 | 123.9 | 5.1 | A | 0 | 0 | 0 | A | A | — |
| Example 3 | B-1 | — | T-1 | P-3 | 3 | 103.5 | 2.5 | B | 0 | 0 | 0 | A | B | — |
| Example 4 | B-1 | — | T-1 | P-4 | 3 | 124.1 | 2.8 | B | 0 | 0 | 0 | A | B | — |
| Example 5 | B-1 | — | T-1 | P-5 | 3 | 72.6 | 6.5 | A | 0 | 0 | 0 | A | A | — |
| Example 6 | B-1 | — | T-1 | P-6 | 3 | 104.3 | 11.2 | A | 0 | 0 | 0 | A | A | — |
| Example 7 | B-1 | — | T-1 | P-7 | 3 | 103.0 | 6.5 | A | 0 | 0 | 0 | A | A | — |
| Example 8 | FUJITAC ZRD40 | — | T-1 | P-8 | 3 | 107.2 | 10.0 | A | 0 | 0 | 0 | A | A | — |
| Example 9 | B-2 | — | T-1 | P-1 | 3 | 90.1 | 11.2 | A | 0 | 0 | 0 | A | — | A |
| Example 10 | B-1 | — | S420 | P-1 | 3 | 88.0 | 11.5 | A | 90 | 25 | 0 | A | A | — |
| Example 11 | B-1 | — | T-1 | P-1 | 40 | 110.5 | 3.0 | B | 0 | 0 | 0 | A | A | — |
| Comparative Example 1 | B-1 | — | T-1 | P-9 | 3 | 92.3 | 1.0 | C | — | — | — | — | C | — |
| Comparative Example 2 | B-1 | P-10 | T-1 | — | — | 114.1 | — | A | 0 | 0 | 0 | A | C | — |
| Comparative Example 3 | B-2 | P-10 | T-1 | — | — | 107.2 | — | A | 0 | 0 | 0 | A | — | C |

As shown in Table 3 above, the optical film and the liquid crystal film according to the embodiment of the present invention exhibited a predetermined effect.

Among these, from the comparison of Examples 1 to 6, it was confirmed that in a case where the photo-alignment compound includes a repeating unit represented by Formula (2), a repeating unit represented by Formula (3), or a repeating unit represented by Formula (6), more excellent effects were obtained.

Example 12

An optical film 12 was prepared according to the same procedure as in Example 1, except that the composition 1 for forming a liquid crystal layer was changed to the following composition 8 for forming a liquid crystal layer.

| Composition 8 for forming liquid crystal layer | |
|---|---|
| The following liquid crystal compound R1 | 42.00 parts by mass |
| The following liquid crystal compound R2 | 42.00 parts by mass |
| The following polymerizable compound A1 | 12.00 parts by mass |
| The following polymerizable compound A2 | 4.00 parts by mass |
| The following polymerization initiator S1 | 0.50 parts by mass |
| Leveling agent T1 | 0.23 parts by mass |
| Polymer P-1 | 3.0 parts by mass |
| HISOLVE MTEM (manufactured by TOHO Chemical Industry Co., Ltd.) | 2.00 parts by mass |
| NK ester A-200 (manufactured by Shin-Nakamura Chemical Co., Ltd.) | 1.00 parts by mass |
| Methyl ethyl ketone | 300.00 parts by mass |

Further, a group adjacent to an acryloyloxy group of the following liquid crystal compounds R1 and R² represents a propylene group (a group in which a methyl group has been substituted with an ethylene group), and the following liquid crystal compounds R1 and R2 represent a mixture of position isomers with different positions of methyl groups.

Liquid Crystal Compound R1

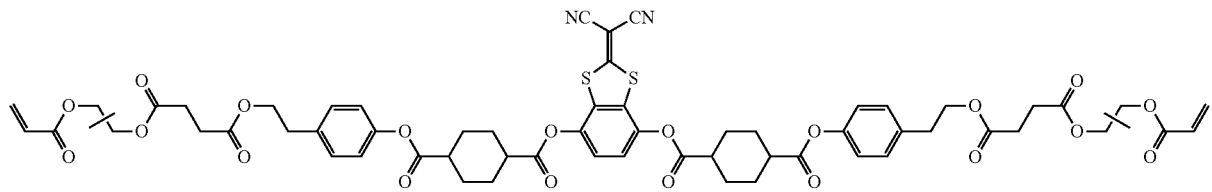

Liquid Crystal Compound R2

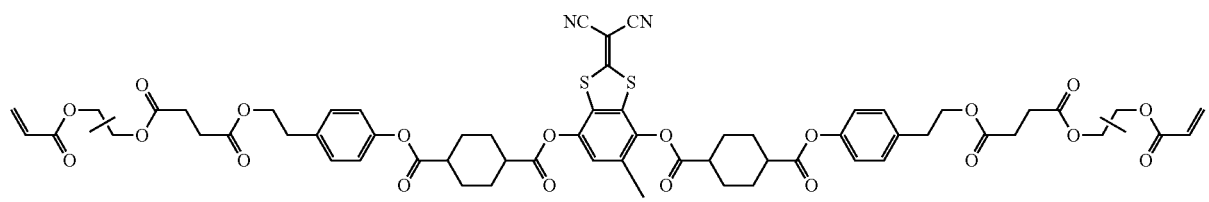

Polymerizable Compound A1

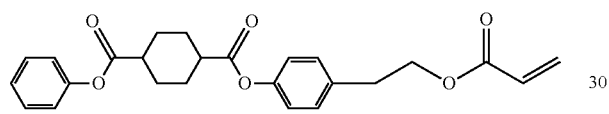

Polymerizable Compound A2

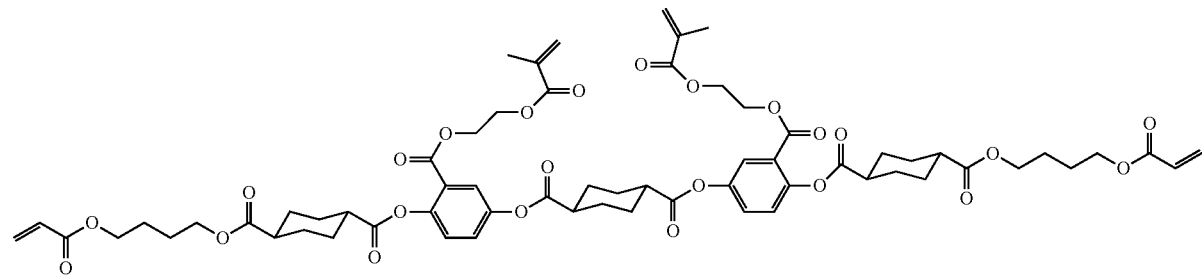 [SMILES: C=CC(=O)OCCCCOC(=O)C1CCC(C(=O)Oc2ccc(OC(=O)C3CCC(C(=O)Oc4ccc(OC(=O)C5CCC(C(=O)OCCCCOC(=O)C=C)CC5)c(C(=O)OCCOC(=O)C(=C)C)c4)CC3)cc2C(=O)OCCOC(=O)C(=C)C)CC1]

Photopolymerization Initiator S1

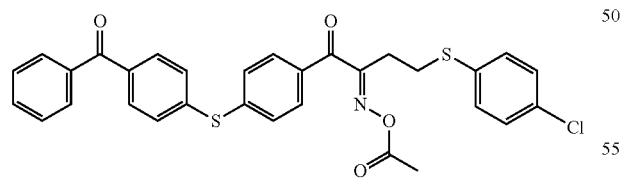

Example 13

An optical film 13 was prepared according to the same procedure as in Example 12, except that the liquid crystal compounds R1 and R2 in the composition 8 for forming a liquid crystal layer were changed to the following liquid crystal compound Z1, and the polymerizable compounds A1 and A2 were changed to the following polymerizable compound A3.

Liquid Crystal Compound Z1

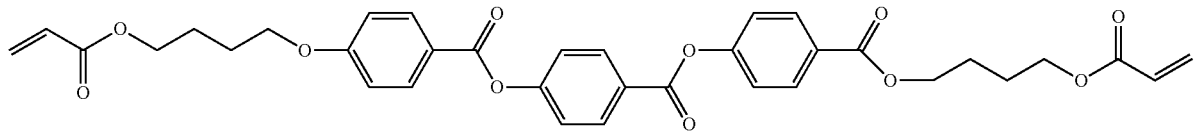 [SMILES: C=CC(=O)OCCCCOC(=O)c1ccc(OC(=O)c2ccc(OC(=O)c3ccc(OCCCCOC(=O)C=C)cc3)cc2)cc1]

Polymerizable Compound A3

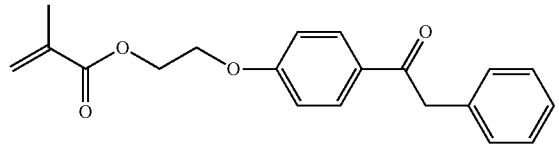 [SMILES: C=C(C)C(=O)OCCOc1ccc(C(=O)Cc2ccccc2)cc1]

Example 14

(Surface Treatment)

A surface of the optical film 12 on a side of the liquid crystal layer prepared in Example 12 was subjected to corona treatment with a discharge amount of 150 W·min/m².

(Formation of Other Optically Anisotropic Layer)

The composition for forming an optically anisotropic layer prepared with the following composition was applied on a surface on which corona treatment was performed with a wire bar coater #4.

Subsequently, the resultant material was heated with hot wind at a temperature of 70° C. for 90 seconds for the purpose of drying a solvent in the composition and aging of the alignment of the liquid crystal compound. The resultant material was subjected to ultraviolet ray irradiation (300 mJ/cm²) at 40° C. and an oxygen concentration of 0.1% under a nitrogen purge, an alignment of the liquid crystal compound was fixed, and the other optically anisotropic layer was prepared on the liquid crystal layer of the optical film 12. The obtained other optically anisotropic layer was a positive C plate satisfying Formula (C1): nz>nx≈ny, and the thickness was about 1.5 μm.

| Composition for forming optically anisotropic layer | |
|---|---|
| The above liquid crystal compound R1 | 10.0 parts by mass |
| The above liquid crystal compound R2 | 54.0 parts by mass |
| The following liquid crystal compound R3 | 28.0 parts by mass |
| The above polymerizable compound A2 | 8.0 parts by mass |
| The following compound B1 | 4.5 parts by mass |
| A-600 (Shin-Nakamura Chemical Co., Ltd.) | 12.0 parts by mass |
| The above polymerization initiator S1 | 3.0 parts by mass |
| The following leveling agent T2 | 0.16 parts by mass |
| The following leveling agent T3 | 0.20 parts by mass |
| Methyl ethyl ketone | 225.0 parts by mass |
| Methanol | 12.5 parts by mass |
| Isopropanol | 12.5 parts by mass |

Liquid crystal compound R3: Mixture of the following liquid crystal compounds (RA), (RB), and (RC) at 83/15/2 (mass ratio).

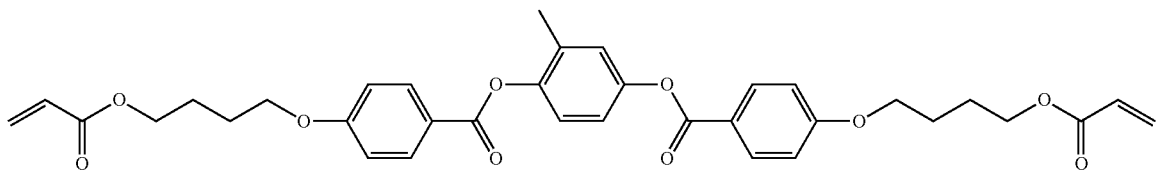
(RA)

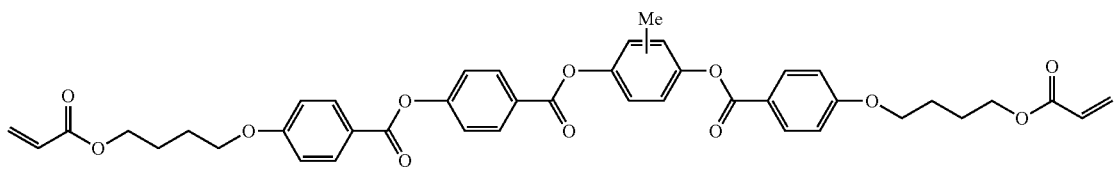
(RB)

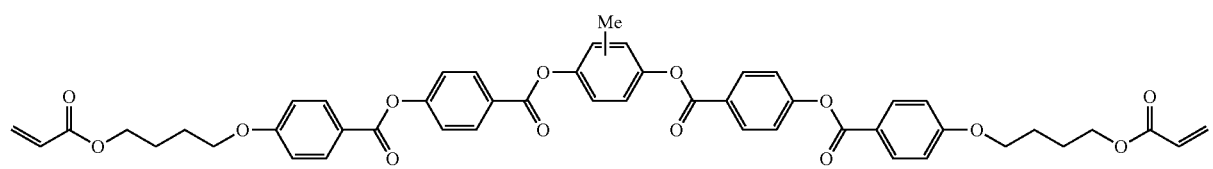
(RC)

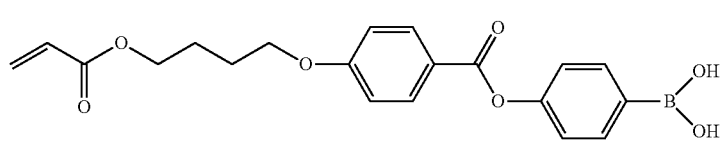
Compound B1

Leveling Agent T2

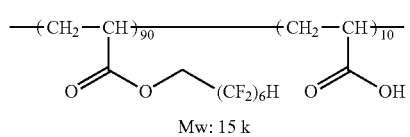

Mw: 15 k
Numerical value in the structure is mass %

Leveling Agent T3 (Weight Average Molecular Weight: 11,200)
(In the following formula: a to d are a:b:c:d=56:10:29:5, and indicate the content (mol %) of each repeating unit with respect to all the repeating units in the polymer.)

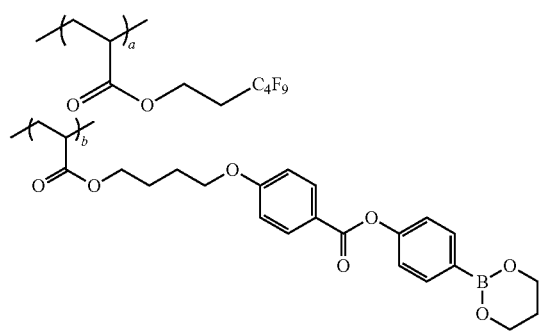
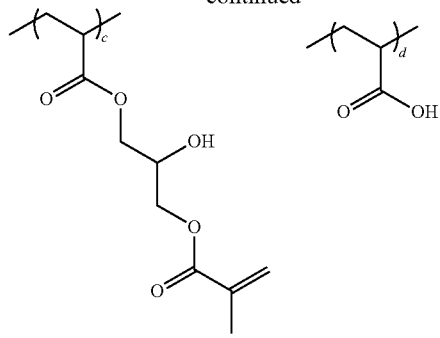

Example 15

An optical film containing the other optically anisotropic layer was prepared according to the same procedure as in Example 14, except that the optical film 12 was changed to the optical film 13, the liquid crystal compounds R1 to R3 in the composition for forming an optically anisotropic layer were changed to the liquid crystal compound Z1, and the polymerizable compound A2 was changed to the polymerizable compound A3.

The above-mentioned evaluation was carried out using the optical films obtained in Examples 12 to 15. The results are shown in Table 4.

TABLE 4

| | Composition for forming photo-alignment layer | | | | | Evaluation result | | | | | | |
|---|---|---|---|---|---|---|---|---|---|---|---|---|
| | | | Photo-alignment compound | Uneven distribution degree in liquid crystal layer | | | Average tilt angle of liquid crystal compound | | | | Durability | |
| | Organic base material Kind | Level-ing agent Kind | Kind | Addition amount (parts by mass) | Level-ing agent ($I_{B1}/I_{B2}$) | Photo-alignment compound ($I_{A1}/I_{A2}$) | Liquid crystal aligning properties | 0% to 20% from surface | 20% to 80% from surface | 80% to 100% from surface | Wind irreg-ularity | Liquid crystal layer | Optical film |
| Example 12 | B-1 | T-1 | P-1 | 3 | 89.1 | 11.5 | A | 0 | 0 | 0 | A | A | — |
| Example 13 | B-1 | T-1 | P-1 | 3 | 89.1 | 11.5 | A | 0 | 0 | 0 | A | A | — |
| Example 14 | B-1 | T-1 | P-1 | 3 | 89.1 | 11.5 | A | 0 | 0 | 0 | A | A | — |
| Example 15 | B-1 | T-1 | P-1 | 3 | 89.1 | 11.5 | A | 0 | 0 | 0 | A | A | — |

As shown in Table 4 above, a desired effect was obtained in any of the embodiments.

EXPLANATION OF REFERENCES

10: Optical film
12: Organic base material
14: Liquid crystal layer

What is claimed is:

1. An optical film comprising:
an organic base material; and
a liquid crystal layer disposed on the organic base material,
wherein the liquid crystal layer includes a photo-alignment compound,
in the liquid crystal layer, the photo-alignment compound is unevenly distributed on a side of the organic base material, and
an uneven distribution degree obtained by an uneven distribution degree calculation method 1 is 2.0 or more,
wherein the uneven distribution calculation method 1 comprises:
in a case where a secondary ion intensity derived from the photo-alignment compound in the liquid crystal layer is measured by a time-of-flight secondary ion mass spectrometry while emitting an ion beam from a surface of the liquid crystal layer on a side opposite to the side of the organic base material toward the side of the organic base material and a region from the surface of the liquid crystal layer on the side opposite to the side of the organic base material to a depth position equivalent to 80% of a total thickness of the liquid crystal layer toward the side of the organic base material is denoted as an upper layer region, and a region from the depth position to a surface of the liquid crystal layer on the side of the organic base material is denoted as a lower layer region, a ratio of a maximum value $I_{A1}$ of a secondary ion intensity derived from the photo-alignment compound in the lower layer region to an average value $I_{A2}$ of a secondary ion intensity derived from the photo-alignment compound in the upper layer region is denoted as an uneven distribution degree.

2. The optical film according to claim 1, wherein the uneven distribution degree is 3.5 or more.

3. The optical film according to claim 1,
wherein the organic base material has a hydrogen-bonding group on a surface on a side of the liquid crystal layer.

4. The optical film according to claim 1,
wherein the photo-alignment compound includes an interacting group selected from the group consisting of a hydrogen-bonding group, a group having a salt structure, a boronic acid group, a boronic acid ester group, and a group represented by Formula (1),

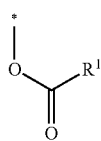
(1)

$R^1$ represents an alkyl group having 1 to 20 carbon atoms, which may have a substituent, in a case where $R^1$ is an alkyl group having 2 to 20 carbon atoms, one or more of —$CH_2$— constituting the alkyl group may be substituted with —O—, —S—, —N(Q)—, —CO—O—, or —CO—, Q represents a substituent, and * represents a bonding position.

5. The optical film according to claim 1, wherein the photo-alignment compound has at least one of repeating units represented by Formulae (2) to (6),

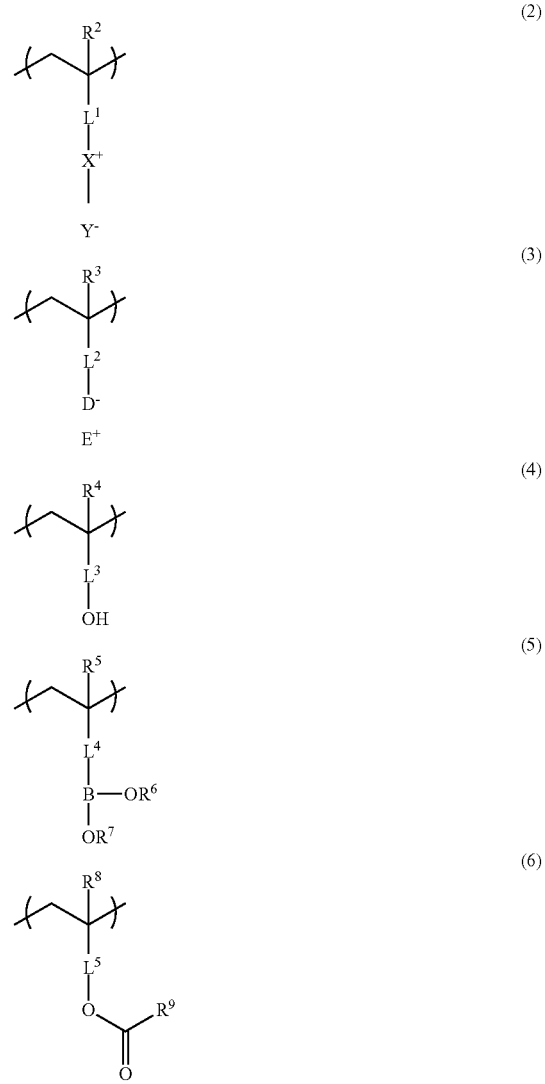

$R^2$, $R^3$, $R^4$, $R^5$, and $R^8$ each independently represent a hydrogen atom or an alkyl group having 1 to 20 carbon atoms, which may have a substituent,
$L^1$, $L^2$, $L^3$, $L^4$, and $L^5$ each independently represent a single bond or a divalent linking group,
$X^+$ represents a cation group, $Y^-$ represents an anion,
$D^-$ represents an anionic group, $E^+$ represents a cation,
$R^6$ and $R^7$ each independently represent a hydrogen atom, an alkyl group which may have a substituent, an aryl group which may have a substituent, or a heteroaryl group which may have a substituent, and any one of $R^6$ or $R^7$ is a hydrogen atom,
$R^9$ represents an alkyl group having 1 to 20 carbon atoms, in a case where $R^9$ is an alkyl group having 2 to 20 carbon atoms, one or more of —$CH_2$— constituting the alkyl group may be substituted with —O—, —S—, —N(Q)—, —CO—O—, or —CO—, and Q represents a substituent.

6. The optical film according to claim 1, wherein the photo-alignment compound has at least one of repeating units represented by Formulae (7) to (9),

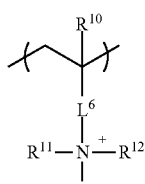

(7)

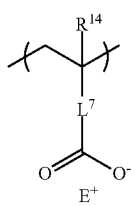

(8)

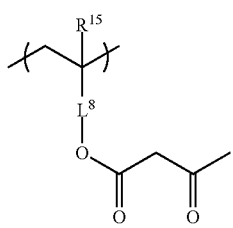

(9)

$R^{10}$, $R^{14}$, and $R^{15}$ each independently represent a hydrogen atom or an alkyl group having 1 to 20 carbon atoms, which may have a substituent, $L^6$, $L^7$, and $L^8$ each independently represent a single bond or a divalent linking group, $Y^-$ represents an anion, $E^+$ represents a cation, $R^{11}$, $R^{12}$, and $R^{13}$ each independently represent a hydrogen atom or an alkyl group having 1 to 20 carbon atoms, which may have a substituent.

7. The optical film according to claim 1, wherein the liquid crystal layer is formed of a composition containing a liquid crystal compound and a photo-alignment compound, and a content of the photo-alignment compound in the composition is 0.01% to 30% by mass with respect to a total mass of the liquid crystal compound.

8. The optical film according to claim 7, wherein a homogeneously aligned liquid crystal compound is fixed to a surface region on the side of the organic base material in the liquid crystal layer.

9. A liquid crystal film comprising two main surfaces, wherein the liquid crystal film contains a photo-alignment compound and a leveling agent, in the liquid crystal film, the leveling agent is unevenly distributed on a side of one main surface, and in the liquid crystal film, the photo-alignment compound is unevenly distributed on a side of the other main surface.

10. The liquid crystal film according to claim 9, wherein an uneven distribution degree obtained by the following uneven distribution degree calculation method 3 is 3.5 or more, uneven distribution degree calculation method 3: in a case where, among two main surfaces of the liquid crystal film, the main surface on the side where the leveling agent is unevenly distributed is denoted as a main surface A, and the other main surface is denoted as a main surface B, a secondary ion intensity derived from the photo-alignment compound in the liquid crystal film is measured by time-of-flight secondary ion mass spectrometry while emitting an ion beam from the main surface A toward the side of the main surface B of the liquid crystal film, and a region from the main surface A of the liquid crystal film to a depth position equivalent to 80% of a total thickness of the liquid crystal film toward the side of the main surface B is denoted as an upper layer region, and a region from the depth position to the main surface B of the liquid crystal film is denoted as a lower layer region, a ratio of a maximum value To of a secondary ion intensity derived from the photo-alignment compound in the lower layer region to an average value $I_{c2}$ of a secondary ion intensity derived from the photo-alignment compound in the upper layer region is denoted as an uneven distribution degree.

11. The liquid crystal film according to claim 9, wherein the leveling agent has a fluorine atom or a silicon atom.

12. The liquid crystal film according to claim 9, wherein the photo-alignment compound includes an interacting group selected from the group consisting of a hydrogen-bonding group, a group having a salt structure, a boronic acid group, a boronic acid ester group, and a group represented by Formula (1),

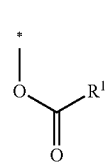

(1)

$R^1$ represents an alkyl group having 1 to 20 carbon atoms, which may have a substituent, in a case where $R^1$ is an alkyl group having 2 to 20 carbon atoms, one or more of —CH$_2$— constituting the alkyl group may be substituted with —O—, —S—, —N(Q)—, —CO—O—, or —CO—, Q represents a substituent, and * represents a bonding position.

13. The liquid crystal film according to claim 9, wherein the photo-alignment compound has at least one of repeating units represented by Formulae (2) to (6),

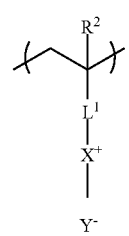

(2)

-continued

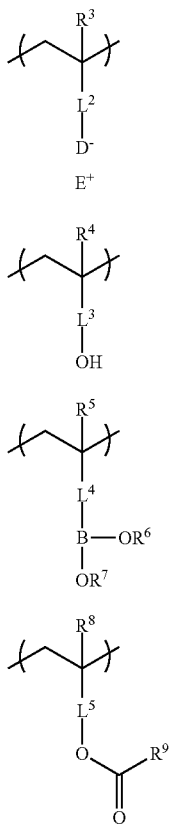

(3)

(4)

(5)

(6)

R², R³, R⁴, R⁵, and R⁸ each independently represent a hydrogen atom or an alkyl group having 1 to 20 carbon atoms, which may have a substituent, $L^1$, $L^2$, $L^3$, $L^4$, and $L^5$ each independently represent a single bond or a divalent linking group, $X^+$ represents a cation group, $Y^-$ represents an anion, $D^-$ represents an anionic group, $E^+$ represents a cation, R⁶ and R⁷ each independently represent a hydrogen atom, an alkyl group which may have a substituent, an aryl group which may have a substituent, or a heteroaryl group which may have a substituent, and any one of R⁶ or R⁷ is a hydrogen atom, R⁹ represents an alkyl group having 1 to 20 carbon atoms, in a case where R⁹ is an alkyl group having 2 to 20 carbon atoms, one or more of —CH₂— constituting the alkyl group may be substituted with —O—, —S—, —N(Q)—, —CO—O—, or —CO—, and Q represents a substituent.

14. The liquid crystal film according to claim 9, wherein the photo-alignment compound has at least one of repeating units represented by Formulae (7) to (9),

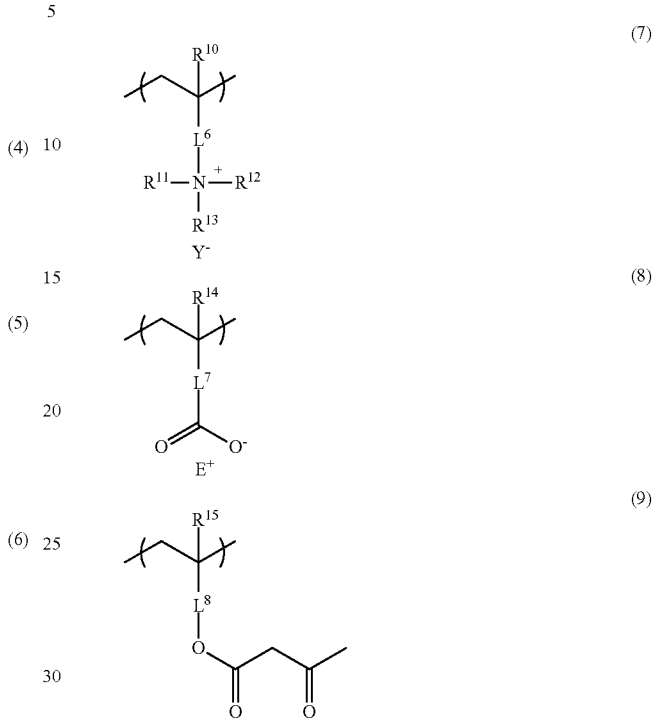

R¹⁰, R¹⁴, and R¹⁵ each independently represent a hydrogen atom or an alkyl group having 1 to 20 carbon atoms, which may have a substituent, $L^6$, $L^7$, and $L^8$ each independently represent a single bond or a divalent linking group, $Y^-$ represents an anion, $E^+$ represents a cation, R¹¹, R¹², and R¹³ each independently represent a hydrogen atom or an alkyl group having 1 to 20 carbon atoms, which may have a substituent.

15. The liquid crystal film according to claim 9, wherein the liquid crystal film is formed of a composition containing a liquid crystal compound and a photo-alignment compound, and
a content of the photo-alignment compound in the composition is 0.01% to 30% by mass with respect to a total mass of the liquid crystal compound.

16. The liquid crystal film according to claim 15, wherein a homogeneously aligned liquid crystal compound is fixed to a surface region on the side where the photo-alignment compound in the liquid crystal film is unevenly distributed.

* * * * *